(12) United States Patent
Lee et al.

(10) Patent No.: US 9,831,378 B2
(45) Date of Patent: Nov. 28, 2017

(54) SEMICONDUCTOR LIGHT EMITTING DEVICE AND METHOD OF MANUFACTURING THE SAME

(71) Applicant: SAMSUNG ELECTRONICS CO., LTD., Suwon-si (KR)

(72) Inventors: Jin Sub Lee, Suwon-si (KR); Jung Sub Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/172,976

(22) Filed: Jun. 3, 2016

(65) Prior Publication Data
US 2017/0040490 A1 Feb. 9, 2017

(30) Foreign Application Priority Data

Aug. 3, 2015 (KR) .................... 10-2015-0109489

(51) Int. Cl.
| | | |
|---|---|---|
| *H01L 33/12* | (2010.01) | |
| *H01L 33/00* | (2010.01) | |
| *H01L 31/0236* | (2006.01) | |
| *H01L 21/02* | (2006.01) | |
| *H01L 33/22* | (2010.01) | |
| *H01L 33/04* | (2010.01) | |

(52) U.S. Cl.
CPC ...... *H01L 33/005* (2013.01); *H01L 21/02458* (2013.01); *H01L 31/0236* (2013.01); *H01L 33/12* (2013.01); *H01L 33/04* (2013.01); *H01L 33/22* (2013.01)

(58) Field of Classification Search
CPC ......... H01L 21/02365; H01L 21/02436; H01L 21/02496; H01L 21/02518
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,835,956 B1 * | 12/2004 | Nagahama ............ C30B 25/20 257/101 |
| 6,858,081 B2 | 2/2005 | Biwa et al. |
| 6,967,353 B2 | 11/2005 | Suzuki et al. |

(Continued)

FOREIGN PATENT DOCUMENTS

| | | |
|---|---|---|
| JP | 2003-197961 A | 7/2003 |
| KR | 10-2013-0021931 A | 3/2013 |

(Continued)

*Primary Examiner* — Cheung Lee
(74) *Attorney, Agent, or Firm* — Sughrue Mion, PLLC

(57) ABSTRACT

A method of manufacturing a semiconductor light emitting device is provided. The method includes forming a first region of a lower semiconductor layer on a substrate, etching an upper surface of the first region using at least one gas used in forming the first region, in-situ in a chamber in which a process of forming the first region has been performed, forming a second region of the lower semiconductor layer on the first region, forming an active layer on the lower semiconductor layer, and forming an upper semiconductor layer on the active layer.

19 Claims, 23 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0121903 A1* | 5/2008 | Hiramatsu .......... H01L 21/0237 257/89 |
| 2009/0166649 A1* | 7/2009 | Lee ...................... H01L 33/007 257/94 |
| 2010/0187495 A1* | 7/2010 | Yoon ................... H01L 21/0237 257/13 |
| 2011/0227037 A1* | 9/2011 | Su ...................... C23C 16/0227 257/13 |
| 2012/0187444 A1 | 7/2012 | Oh et al. |
| 2012/0211771 A1 | 8/2012 | Tu et al. |
| 2012/0217537 A1 | 8/2012 | Jin et al. |
| 2015/0155437 A1 | 6/2015 | Singh et al. |

FOREIGN PATENT DOCUMENTS

| | | |
|---|---|---|
| KR | 10-1245509 B1 | 3/2013 |
| KR | 10-2013-0128745 A | 11/2013 |
| KR | 10-2014-0022631 A | 2/2014 |
| KR | 10-2015-0027770 A | 3/2015 |
| WO | 2013/172595 A1 | 11/2013 |

\* cited by examiner

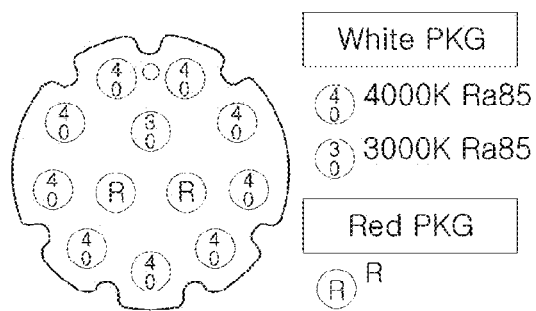 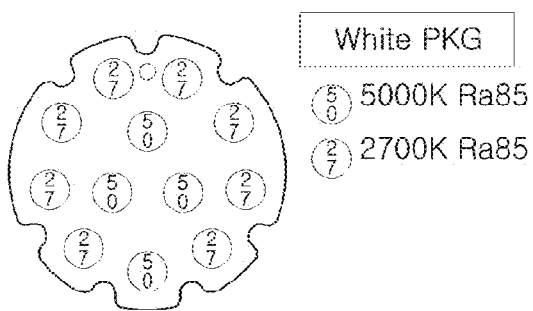
FIG. 17A                    FIG. 17B

SEMICONDUCTOR LIGHT EMITTING DEVICE AND METHOD OF MANUFACTURING THE SAME

CROSS-REFERENCE TO RELATED APPLICATION

This application claims the priority from Korean Patent Application No. 10-2015-0109489, filed on Aug. 3, 2015 with the Korean Intellectual Property Office, the disclosure of which is incorporated herein by reference.

BACKGROUND

Methods, apparatuses, devices, and articles of manufacture consistent with the present inventive concept relate to a semiconductor light emitting device and a method of manufacturing the same.

Semiconductor light emitting devices emit light through the recombination of electrons and holes when current is applied thereto. Semiconductor light emitting devices have been widely used due to many positive attributes such as low power consumption, a high degree of brightness, miniaturization, and the like. In particular, after a nitride-based light emitting device was developed, the range of utility thereof has been further increased. Thus, semiconductor light emitting devices have been employed in backlight units, home lighting devices, automotive lighting devices, and the like.

As the use of semiconductor light emitting devices increases, the range of utility thereof has been expanded to the light source field, for example, high current/high output light source fields. As such, as semiconductor light emitting devices are used in high current/high output fields, research in the art for improved light emitting efficiency therein has continued. In particular, a semiconductor light emitting device including a reflector and a manufacturing technology thereof to improve external light extraction efficiency has been proposed.

SUMMARY

An aspect of the present inventive concept may provide a semiconductor light emitting device having improved light characteristics and a method of manufacturing the same.

According to an aspect of an exemplary embodiment, there is provided a method of manufacturing a semiconductor light emitting device, the method including forming a first region of a lower semiconductor layer on a substrate, etching an upper surface of the first region using at least one gas used in forming the first region, in-situ in a chamber in which a process of forming the first region has been performed, forming a second region of the lower semiconductor layer on the first region, forming an active layer on the lower semiconductor layer, and forming an upper semiconductor layer on the active layer.

The at least one gas may be carrier gas used in forming the first region.

The at least one gas may be hydrogen ($H_2$) gas.

In the etching of the upper surface of the first region, concave-convex portions may be formed on the upper surface of the first region.

The second region may be formed to have a flat upper surface while filling the concave-convex portions.

The second region may be formed to have a flat upper surface while forming voids on the concave-convex portions.

The forming of the first region, the etching of the upper surface of the first region, and the forming of the second region may be performed in-situ in the chamber.

Portions of the first and second regions adjacent to an interface between the first and second regions may be formed using a same material.

The etched upper surface of the first region may be a layer formed of an aluminum nitride.

In the etching of the upper surface of the first region, an inflow of nitride source gas for formation of the aluminum nitride may be blocked.

The first and second regions may be formed at a temperature of about 1150° C. to about 1250° C.

The chamber may be a chamber for metal organic chemical vapor deposition (MOCVD).

The lower semiconductor layer may include a buffer layer and a first conductivity-type semiconductor layer sequentially disposed on the substrate.

The first region may be formed of a portion of the buffer layer.

The first region may comprise the buffer layer and a portion of the first conductivity-type semiconductor layer.

The lower semiconductor layer may further include a superlattice layer disposed between the buffer layer and the first conductivity-type semiconductor layer.

According to another aspect of an exemplary embodiment, there is provided a method of manufacturing a semiconductor light emitting device, the method including forming a first region of a lower semiconductor layer on a substrate, etching a portion of the first region using at least one of gases used in forming the first region, forming a second region of the lower semiconductor layer on the first region, forming an active layer on the lower semiconductor layer, and forming an upper semiconductor layer on the active layer.

The forming of the first region and the etching of a portion of the first region may be performed in-situ with a single piece of equipment.

The second region may be formed to have a flat upper surface.

The first region may be an AlN layer, and the at least one gas may include hydrogen ($H_2$) gas.

According to an aspect of another exemplary embodiment, there is provided a semiconductor light emitting device including a substrate, a lower semiconductor layer provided on the substrate and including first region and a second region provided on the first region, an active layer provided on the lower semiconductor layer, and an upper semiconductor layer provided on the active layer. An interface between the first and second regions may be an uneven surface, and the first region and the second region located above and below the interface, respectively, may be formed of the same material.

The lower semiconductor layer may include a buffer layer and a first conductivity-type semiconductor layer sequentially provided on the substrate, and the uneven surface may be located in the first conductivity-type semiconductor layer.

The lower semiconductor layer may include a buffer layer and a first conductivity-type semiconductor layer sequentially provided on the substrate, and the uneven surface may be located on an interface between the buffer layer and the first conductivity-type semiconductor layer.

The uneven surface may include voids.

The voids may be formed along crystal planes of the first and second regions.

According to an aspect of another exemplary embodiment, there is provided a method of manufacturing a semiconductor light emitting device, the method including a plurality of semiconductor layers, the method comprising etching, during a manufacturing process, a contact interface between two of the plurality of semiconductor layers to form an uneven surface at the contact interface which prevents threading dislocations and/or cracks in semiconductor layers subsequently disposed in the manufacturing process; and forming an active layer on the plurality of semiconductor layers.

During the manufacturing process, the semiconductor layers may be formed on a substrate, and the substrate and a semiconductor layer contacting the substrate, of the plurality of semiconductor layers, may be formed of different materials.

The uneven surface may comprise concave-convex portions.

The uneven surface may comprise or further comprise a plurality of voids.

BRIEF DESCRIPTION OF DRAWINGS

The above and/or other aspects will be more clearly understood from the following detailed description taken in conjunction with the accompanying drawings, in which:

FIGS. 17A and 17B are schematic views illustrating a white light source module according to an exemplary embodiment;

DETAILED DESCRIPTION

Figure 1:
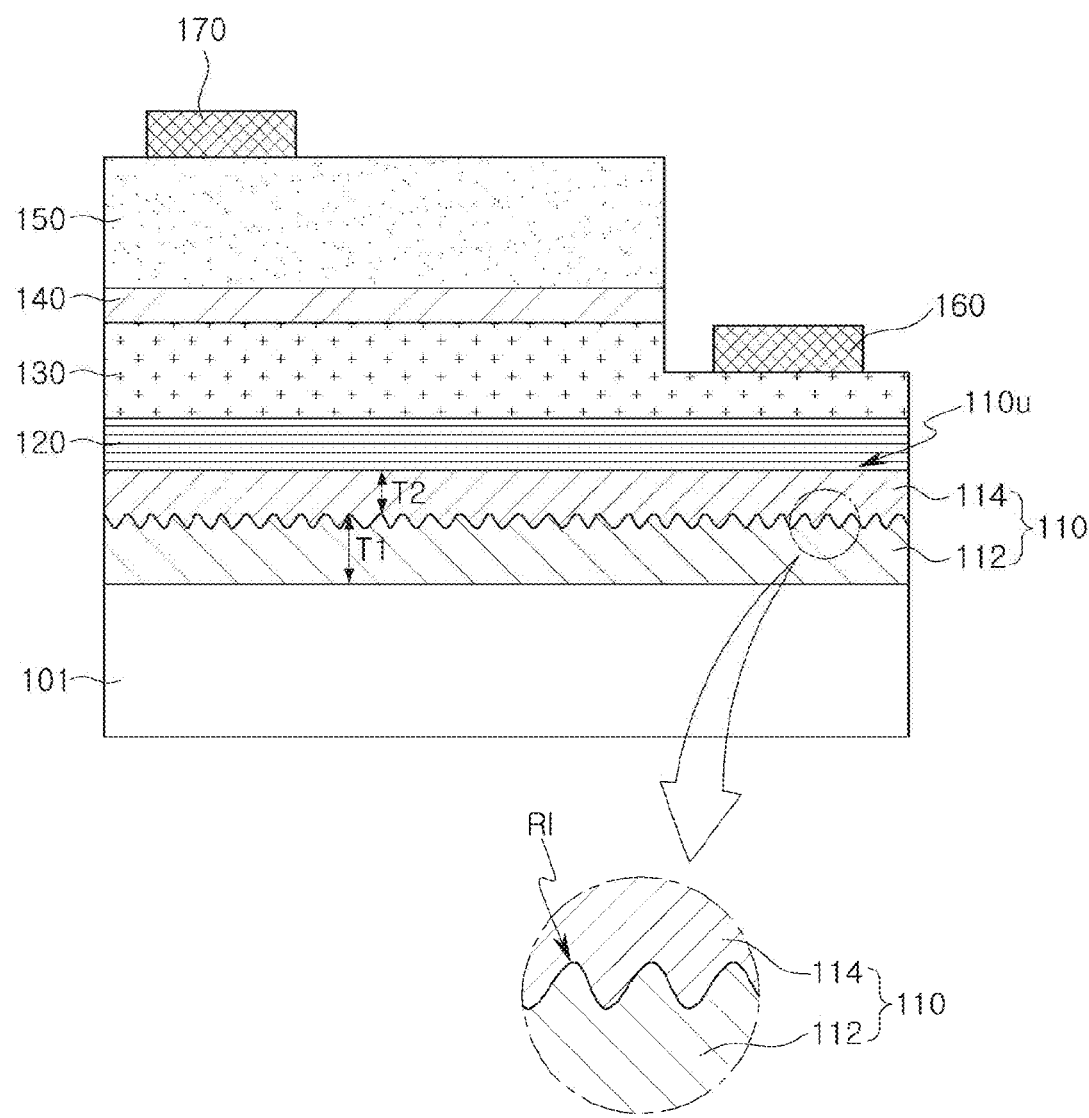
FIG. 1 is a schematic cross-sectional view of a semiconductor light emitting device according to an exemplary embodiment.

Hereinafter, exemplary embodiments will be described with reference to the attached drawings.

The present inventive concept may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms "first", "second", "third", etc. may be used herein to describe various members, components, regions, layers and/or sections, these members, components, regions, layers and/or sections should not be limited by these terms. These terms are only used to distinguish one member, component, region, layer or section from another region, layer or section. Thus, a "first" member, component, region, layer or section discussed below could be termed a "second" member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular exemplary embodiments only and is not intended to be limiting of the present inventive concept. As used herein, the singular forms "a," "an," and "the" are intended to include the plural forms as well, unless the context clearly indicates otherwise. It will be further understood that the terms "includes," "including," "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, exemplary embodiments of the present inventive concept will be described with reference to schematic views illustrating embodiments of the present inventive concept. In the drawings, for example, due to manufacturing techniques and/or tolerances, modifications of the shape shown may be estimated. Thus, exemplary embodiments of the present inventive concept should not be construed as being limited to the particular shapes of regions shown herein, for example, to include a change in shape results in manufacturing. The following exemplary embodiments may also be constituted by one or a combination thereof.

The contents of the present inventive concept described below may have a variety of configurations and propose only a required configuration herein, but are not limited thereto.

FIG. 1 is a schematic cross-sectional view of a semiconductor light emitting device according to an exemplary embodiment.

With reference to FIG. 1, a semiconductor light emitting device 100 may include a substrate 101, a buffer layer 110 disposed on the substrate 101, a superlattice layer 120, a first conductivity-type semiconductor layer 130, an active layer 140, and a second conductivity-type semiconductor layer 150. The semiconductor light emitting device 100 may further include a first electrode 160 and a second electrode 170 as electrode structures.

The substrate 101 may be provided as a semiconductor growth substrate. The substrate 101 may be formed using an insulating, conductive, semiconductor material such as, for example, sapphire, silicon (Si), SiC, $MgAl_2O_4$, MgO, $LiAlO_2$, $LiGaO_2$, GaN, or the like. In this case, sapphire may be a crystal having Hexa-Rhombo R3c symmetry, may have lattice constants of 13.001 Å and 4.758 Å in c-axis and a-axis directions, respectively, and may have a C (0001) plane, an A (11-20) plane, an R (1-102) plane and the like. In this case, since the C plane comparatively facilitates the growth of a nitride thin film and is stable at relatively high temperatures, sapphire may be mainly used for a growth substrate for a nitride semiconductor.

Although not illustrated in the drawings, a plurality of concave-convex portions may be formed on a growth surface of the substrate 101, for example, a growth surface of semiconductor layers. Light emission efficiency and crystallinity of semiconductor layers disposed on the concave-convex portions, and the like, may be improved by such a structure such as the concave-convex portions.

The buffer layer 110 may be disposed on the substrate 101, and may be a layer for improvement in crystallinity of the first conductivity-type semiconductor layer 130, the active layer 140, and the second conductivity-type semiconductor layer 150 formed on the buffer layer. The buffer layer 110 may include a first buffer layer 112 and a second buffer layer 114.

An interface between the first and second buffer layers 112 and 114 may be an uneven surface on which the concave-convex portions RI are formed, as shown in FIG. 1 and the inset of FIG. 1. The concave-convex portions RI may be formed by etching a portion of the first buffer layer 112 to form an uneven surface having roughness, and forming the second buffer layer 114 thereon. The etching of the uneven surface will be described below in further detail with reference to FIGS. 9B and 9C. The size, shape, arrangement, and the like of the concave-convex portions RI are not limited to those depicted in the drawings, and may be variously changed. The first and second buffer layers 112 and 114 may be in contact with each other without a gap on the interface therebetween on which the concave-convex portions RI are formed. An upper surface 110u of the buffer layer 110, such as the upper surface 110u of the second buffer layer 114, may be a flat surface. In order for the second buffer layer 114 to have the flat upper surface while being formed on the concave-convex portions RI, processing conditions during the growth of the second buffer layer 114 may be controlled.

The buffer layer 110 may be formed of, for example, aluminum gallium nitride ($Al_xGa_{1-x}N$, $0 \leq x \leq 1$) grown without doping. The first and second buffer layers 112 and 114 may have the same composition or different compositions. For example, the first and second buffer layers 112 and 114 may both be AlN layers, or the first buffer layer 112 may be an AlN layer, and the second buffer layer 114 may be an AlGaN layer.

The first buffer layer 112 may have a first thickness T1, and the second buffer layer 114 may have a second thickness T2. In some exemplary embodiments, the first thickness T1 may be greater than the second thickness T2, but is not limited thereto. The first thickness T1 and the second thickness T2 may be within a range of hundreds of nanometers to several micrometers, for example, about 500 nm to about 10 μm, respectively.

The superlattice layer 120 may be a layer in which a plurality of layers having different levels of bandgap energy are alternately stacked. The plurality of layers forming the superlattice layer 120 may have a composition of $In_xAl_yGa_{(1-x-y)}N$ ($0 \leq x \leq 1$, $0 \leq y \leq 1$, $0 \leq x+y \leq 1$), respectively, and may also include an n-type impurity. For example, the superlattice layer 120 may have, a GaN/InGaN-based, AlGaN/GaN-based, AlGaN/GaN/InGaN-based multilayer repeated structure. Each of the plurality of layers forming the superlattice layer 120 may have a thickness of, for example, about 1 nm to about 500 nm.

In the case of the superlattice layer 120 formed of the plurality of layers, a two-dimensional electron gas layer may be formed on an interface between the plurality of layers due to the discontinuous energy band of the plurality of layers having different levels of bandgap energy. Thus, a tunneling phenomenon may be generated through the two dimensional electron gas layer when a voltage is applied thereto. Thus, a cladding effect of the first conductivity-type semiconductor layer 130 disposed on the superlattice layer 120 may be improved, and relatively high carrier mobility may be secured, to improve a current diffusion effect. This superlattice layer 120 may also be omitted according to some example embodiments.

The first and second conductivity-type semiconductor layers 130 and 150 may be configured of semiconductors doped with an n-type impurity and a p-type impurity, respectively, but are not limited thereto. For example, the first and second conductivity-type semiconductor layers 130 and 150 may be configured of a p-type semiconductor and an n-type semiconductor, respectively. The first and second conductivity-type semiconductor layers 130 and 150 may be configured of a nitride semiconductor, for example, formed of a material having a composition of $Al_xIn_yGa_{1-x-y}N$ (0≤x≤1, 0≤y≤1, 0≤x+y≤1). Although the first and second conductivity-type semiconductor layers 130 and 150 may be respectively configured of a single layer, the first and second conductivity-type semiconductor layers 130 and 150 may also include a plurality of layers having different characteristics such as in doping concentration, composition, and the like. The first and second conductivity-type semiconductor layers 130 and 150 may be formed using an AlInGaP or AlInGaAs-based semiconductor, besides a nitride semiconductor. In some exemplary embodiments, the first conductivity-type semiconductor layer 130 may be an n-type gallium nitride (n-GaN) layer doped with, for example, silicon (Si) or carbon (C), and the second conductivity-type semiconductor layer 150 may be a p-type gallium nitride (p-GaN) layer doped with, for example, magnesium (Mg) or zinc (Zn).

The active layer 140 may be disposed between the first and second conductivity-type semiconductor layers 130 and 150 to emit light having an amount of energy through the recombination of electrons and holes. The amount of energy may be predetermined. The active layer 140 may be a layer formed of a single material such as indium gallium nitride (InGaN) or the like, but may have a single quantum well (SQW) structure or a multiple quantum well (MQW) structure in which a quantum well layer and a quantum barrier layer are alternately disposed, for example, a GaN/InGaN structure in the case of a nitride semiconductor.

For example, when the active layer 140 includes InGaN, the content of indium (In) may be increased to reduce crystalline defects occurring due to lattice mismatching and to increase internal quantum efficiency of the semiconductor light emitting device 100. According to the content of indium (In) in the active layer 140, a light emitting wavelength may be adjusted.

As the concave-convex portions RI are formed in the buffer layer 110 that is a portion of lower semiconductor layers formed before the growth of the active layer 140, stress applied to the active layer 140 may be reduced, and a threading dislocation density in the active layer 140 may also be reduced. Thus, the active layer 140 may have improved crystallinity, and light characteristics of the semiconductor light emitting device 100 may be improved.

The first and second electrodes 160 and 170 may be disposed on the first and second conductivity-type semiconductor layers 130 and 150 to be electrically connected to each other, respectively. The first and second electrodes 160 and 170 may be configured of a single layer or a multilayer structure formed of a conductive material.

For example, the first and second electrodes 160 and 170 may include one or more of gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chrome (Cr), tungsten (W), ruthenium (Ru), rhodium (Rh), iridium (Jr), nickel (Ni), palladium (Pd), platinum (Pt), and alloys thereof. In some exemplary embodiments, at least one of the first and second electrodes 160 and 170 may be a transparent electrode, and for example, may be formed of indium tin oxide (ITO), aluminum zinc oxide (AZO), indium zinc oxide (IZO), zinc oxide (ZnO), ZnO:Ga (GZO), indium oxide ($In_2O_3$), tin oxide ($SnO_2$), cadmium (CdO), cadmium tin oxide ($CdSnO_4$), or gallium oxide ($Ga_2O_3$).

The location and shape of the first and second electrodes 160 and 170 illustrated in FIG. 1 are provided by way of example, and thus, may be variously changed according to exemplary embodiments. In some exemplary embodiments, an ohmic electrode layer may further be disposed on the second conductivity-type semiconductor layer 150, and the ohmic electrode layer may include, for example, p-GaN containing a high concentration p-type impurity. Alternatively, the ohmic electrode layer may be formed of a metal or a transparent conductive oxide.

Figure 2:
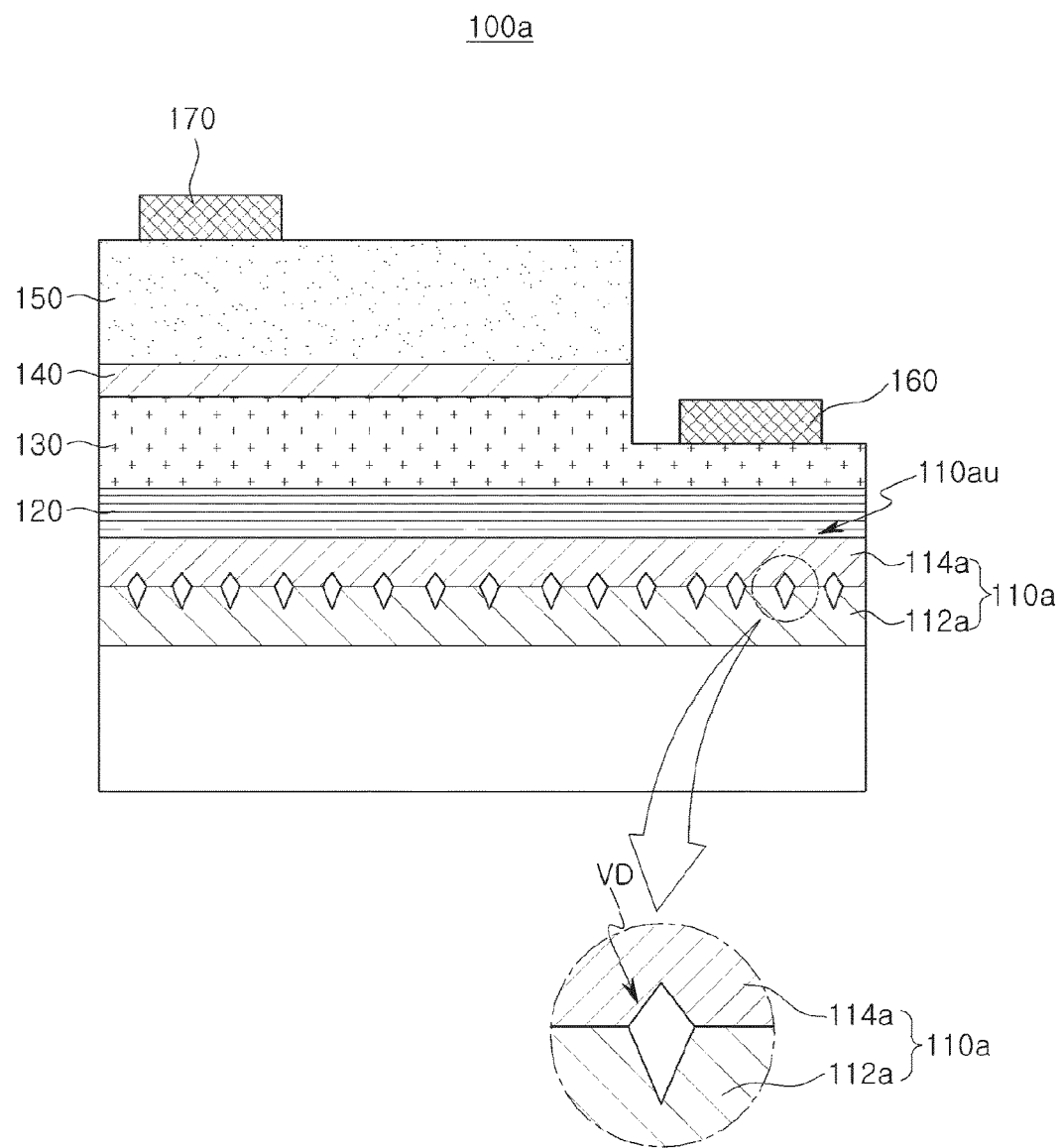
FIGS. 2 to 4 are schematic cross-sectional views of semiconductor light emitting devices according to exemplary embodiments.
Figure 3:
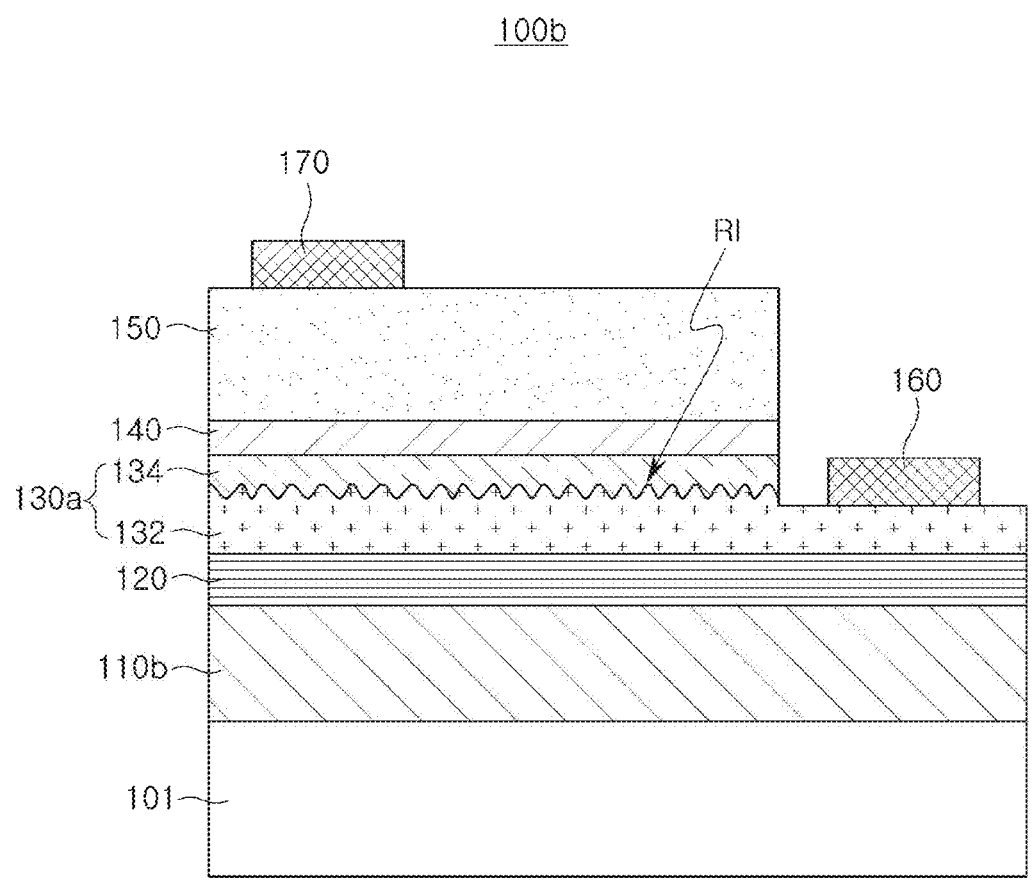
Figure 4:
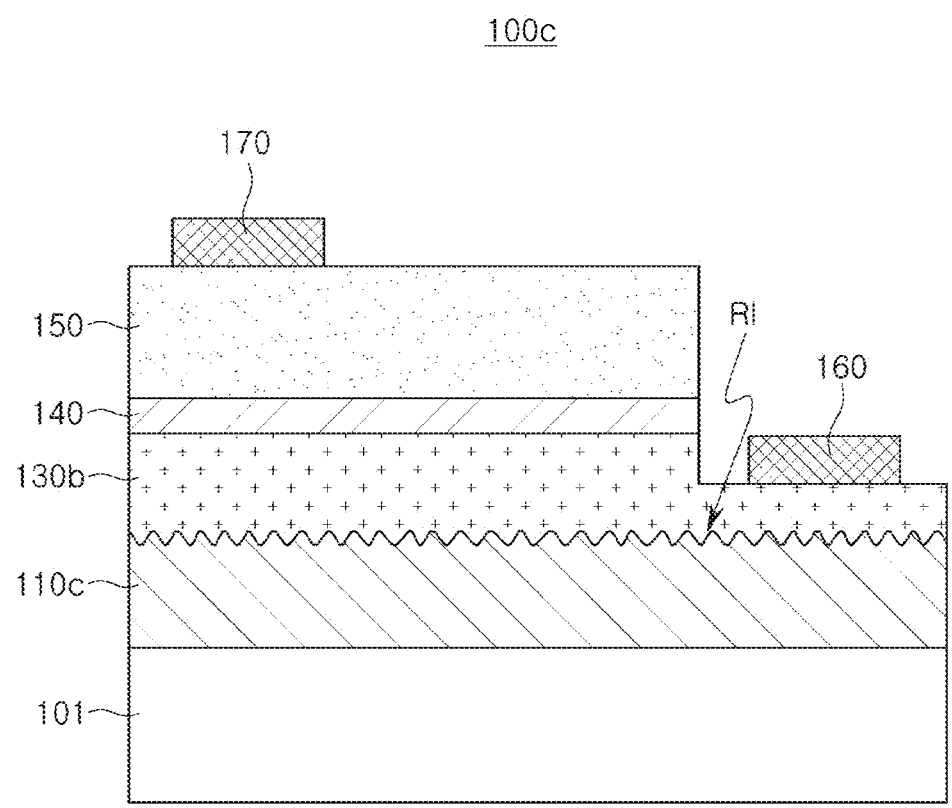

FIGS. 2 to 4 are schematic cross-sectional views of semiconductor light emitting devices according to exemplary embodiments.

With reference to FIG. 2, a semiconductor light emitting device 100a may include a substrate 101, a buffer layer 110a disposed on the substrate 101, a superlattice layer 120, a first conductivity-type semiconductor layer 130, an active layer 140, and a second conductivity-type semiconductor layer 150. The semiconductor light emitting device 100a may further include a first electrode 160 and a second electrode 170 as electrode structures.

The buffer layer 110a may include a first buffer layer 112a and a second buffer layer 114a. In some exemplary embodiments, voids VD may be formed at an interface between the first and second buffer layers 112a and 114a in a manner different from the exemplary embodiment of FIG. 1. The voids VD may be formed by etching a portion of the first buffer layer 112a and allowing the second buffer layer 114a to be grown thereon. The etching of the voids will be described below in further detail with reference to FIGS. 11A and 11B. The size, shape, arrangement, and the like of the voids VD are not limited to those depicted in the drawings, and may be variously changed. In some exemplary embodiments, concave-convex portions may further be formed in a region of an interface between the first and second buffer layers 112a and 114a, in which the voids VD are not formed.

An upper surface 110au of the buffer layer 110a, for example, the upper surface 110au of the second buffer layer 114a, may be a flat surface. In order for the second buffer layer 114a to have the flat upper surface while being formed on the voids VD, processing conditions during the growth of the second buffer layer 114a may be adjusted.

With reference to FIG. 3, a semiconductor light emitting device 100b may include a substrate 101, a buffer layer 110b disposed on the substrate 101, a superlattice layer 120, a first conductivity-type semiconductor layer 130a, an active layer 140, and a second conductivity-type semiconductor layer 150. The semiconductor light emitting device 100b may further include a first electrode 160 and a second electrode 170 as electrode structures.

In the exemplary embodiment of FIG. 3, the buffer layer 110b may be configured of a single layer in a manner different from the exemplary embodiments of FIGS. 1 and 2, and thus, may not include an uneven surface having concave-convex portions RI (see FIG. 1) formed therein, or voids VD (see FIG. 2) formed therein.

The concave-convex portions RI may be located in the first conductivity-type semiconductor layer 130a. Thus, the first conductivity-type semiconductor layer 130a may include a first layer 132 and a second layer 134 disposed vertically, based on the uneven surface. In this case, an upper surface of the first conductivity-type semiconductor layer 130a, for example, an upper surface of the second layer 134, may be flat. The first and second layers 132 and 134 may have the same composition or different compositions.

In some exemplary embodiments, the first conductivity-type semiconductor layer 130a may also include voids VD, as in the exemplary embodiment of FIG. 2. In other exemplary embodiments, the first conductivity-type semiconductor layer 130a may include voids VD in addition to the uneven surface.

With reference to FIG. 4, a semiconductor light emitting device 100c may include a substrate 101, a buffer layer 110c disposed on the substrate 101, a first conductivity-type semiconductor layer 130b, an active layer 140, and a second conductivity-type semiconductor layer 150. The semiconductor light emitting device 100c may further include a first electrode 160 and a second electrode 170 as electrode structures.

In the exemplary embodiment shown in FIG. 4, the buffer layer 110c and the first conductivity-type semiconductor layer 130b may be configured of a single layer in a manner different from the exemplary embodiments of FIGS. 1 to 3, and concave-convex portions RI may be formed on an interface between the buffer layer 110c and the first conductivity-type semiconductor layer 130b. An upper surface of the first conductivity-type semiconductor layer 130b may be flat.

In some exemplary embodiments, the first conductivity-type semiconductor layer 130a may also include voids VD in addition to the uneven surface, as in the exemplary embodiment of FIG. 2. In such as case, the voids VD as in the exemplary embodiment of FIG. 2 may be formed at an interface between the buffer layer 110c and the first conductivity-type semiconductor layer 130b, instead of the concave-convex portions RI.

As illustrated in the exemplary embodiments of FIGS. 1 to 4, at least one layer of semiconductor layers disposed between the substrate 101 and the active layer 140 may include an uneven surface on which the concave-convex portions RI are formed, or voids VD, or both concave-convex portions RI and voids VD. In some embodiments, two or more layers may respectively include the uneven surface or the voids VD. The concave-convex portions RI or the voids VD may be formed on at least one of interfaces between the plurality of layers disposed between the substrate 101 and the active layer 140.

Figure 5:
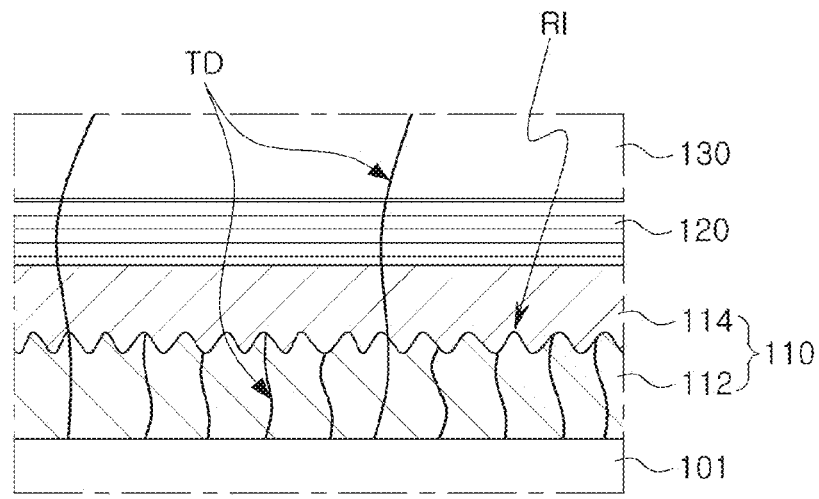
FIG. 5 is a partial cross-sectional view illustrating characteristics of a semiconductor light emitting device according to an exemplary embodiment.

FIG. 5 is a partial cross-sectional view illustrating characteristics of a semiconductor light emitting device according to an exemplary embodiment.

With reference to FIG. 5, a portion of constituent elements of the semiconductor light emitting device 100 of FIG. 1 is illustrated. When the first buffer layer 110 is grown from the substrate 101, for example, in a case in which the substrate 101 is formed of sapphire and the first buffer layer 110 is formed of AlN, threading dislocations TD may be formed inside the first buffer layer 110 due to a mismatch of lattice constants.

The threading dislocations TD may be vertically extended according to the growth of the buffer layer 110. However, the extension of a majority of the threading dislocations TD may be stopped at an interface between the first and second buffer layers 112 and 114 at which the concave-convex portions RI are formed, so as not to extend upwardly along the second buffer layer 114. Thus, a density of the threading dislocations TD in semiconductor layers above the first buffer layer 112 may be lowered. This lowering of the density of the TDs occurs by stopping continuous crystal growth and curing defects while the second buffer layer 114 is grown after a portion of the first buffer layer 112 is removed.

Further, when the substrate 101 and the first buffer layer 112 are formed of different materials, stress may be applied to the substrate 101 and the first buffer layer 112 in opposite directions, respectively. For example, when the substrate 101 is formed of sapphire and the first buffer layer 112 is formed of AlN, compressive stress may be applied to the substrate 101, and tensile stress may be applied to the first buffer layer 112. Cracks may occur in the first buffer layer 112 due to the stress. Such stress may also be relieved while the second buffer layer 114 is grown after a portion of the first buffer layer 112 is removed, and thus, cracks may be reduced.

Figure 6:
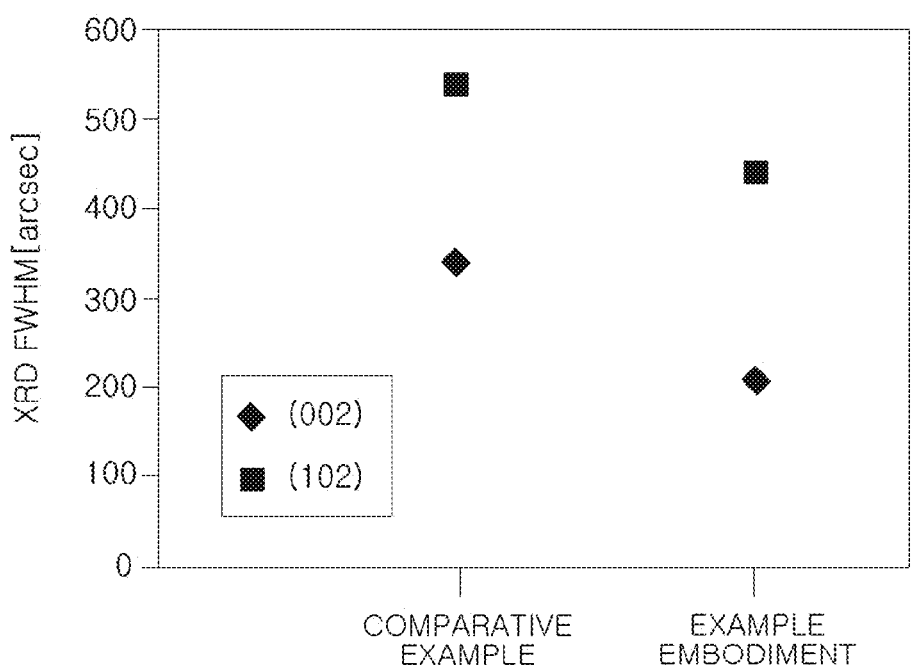
FIGS. 6 and 7 are graphs illustrating semiconductor light emitting device characteristics according to an exemplary embodiment.
Figure 7:
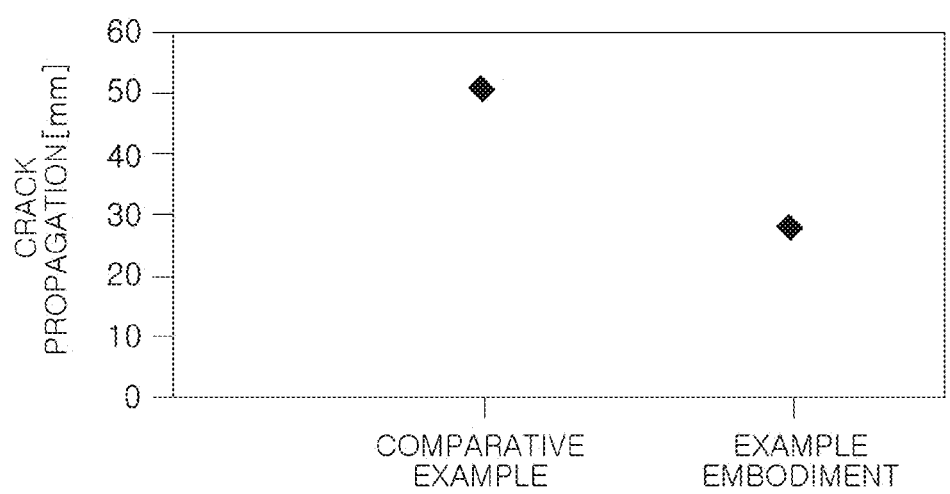

FIGS. 6 and 7 are graphs illustrating semiconductor light emitting device characteristics according to an exemplary embodiment.

With reference to FIG. 6, X-ray diffraction (XRD) analysis results for a comparative example and an example embodiment are illustrated. An example embodiment corresponds to a structure in which the substrate 101 formed of sapphire, the buffer layer 110 formed of AlN, and the first conductivity-type semiconductor layer 130 formed of n-AlGaN are grown in the structure of the semiconductor light emitting device 100 as in FIG. 1. The comparative example corresponds to a structure in which the buffer layer 110 is configured of a single layer, and other structures are the same as the example embodiment. Full widths at half maximum (FWHM) values at the peak with respect to crystal planes of the (002) plane and the (102) planes are compared to each other by the XRD analysis.

As illustrated in FIG. 6, it can be appreciated that, on respective crystal planes, the full width at half maximum in the example embodiment is smaller than that in the comparative example. In detail, in the case of the (002) plane, a value in the comparative example was 340 arcsec, and a value in the example embodiment was 206 arcsec. In the case of the (102) plane, 540 arcsec was represented in the comparative example, and 440 arcsec was represented in the example embodiment. It can be appreciated therefrom that crystallinity of a semiconductor layer including the first conductivity-type semiconductor layer 130 were further improved over the case of the comparative example.

With reference to FIG. 7, analysis results of crack propagation in the comparative example and the example embodiment are illustrated. The example embodiment and the comparative example are the same as the cases of FIG. 6. Distances of crack propagation from one end of a wafer with respect to semiconductor layers formed on a 4-inch sapphire wafer were measured and compared.

As illustrated in FIG. 7, in the case of the example embodiment, it can be appreciated that crack propagation is 28 mm, which is a relatively small value, about 50% to 60% of 51 mm of the comparative example. It can be appreciated in the example embodiment that stress applied to the inside of the semiconductor layers is reduced, and thus crack propagation is reduced, as compared to the comparative example.

Figure 8A:
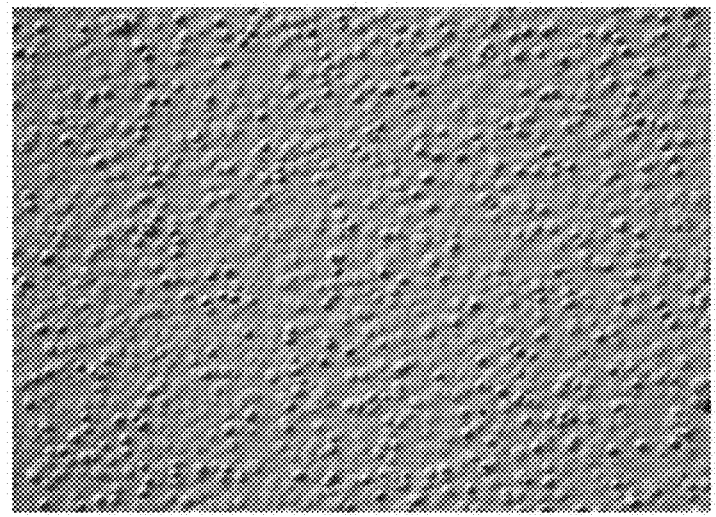
FIGS. 8A and 8B are images illustrating semiconductor light emitting device characteristics according to an exemplary embodiment.
Figure 8B:
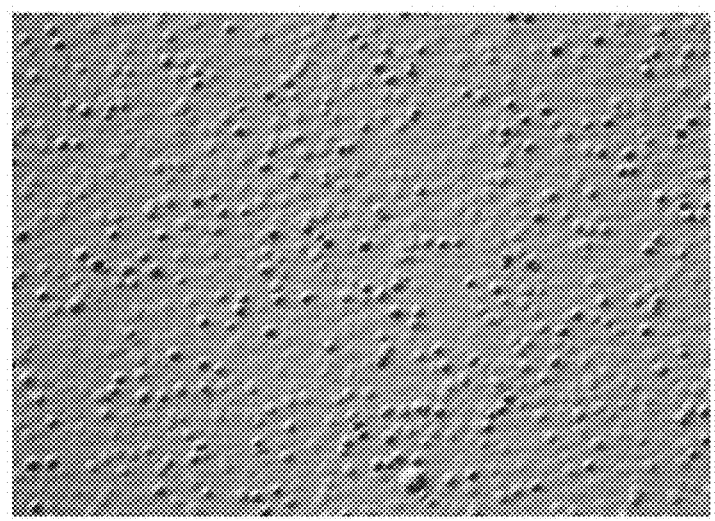

FIGS. 8A and 8B are images illustrating semiconductor light emitting device characteristics according to an exemplary embodiment.

With reference to FIGS. 8A and 8B, results of analyzing semiconductor layer surfaces in the comparative example and the example embodiment, respectively, using an optical microscope are illustrated. The example embodiment and the comparative example are the same cases as the cases of FIGS. 6 and 7.

In FIGS. 8A and 8B, a semiconductor layer surface may have a convex morphology having a form such as a hillock due to threading dislocations. In comparing the comparative example (FIG. 8A) and the example embodiment (FIG. 8B) to each other, in the case of the comparative example, a relatively large amount of threading dislocations occurred as compared to the example embodiment, and thus, it can be appreciated therefrom that a density of the threading dislocations was relatively reduced in the example embodiment.

FIGS. 9A to 9F are cross-sectional views schematically illustrating processes of manufacturing a semiconductor light emitting device according to an exemplary embodiment.

Figure 10:
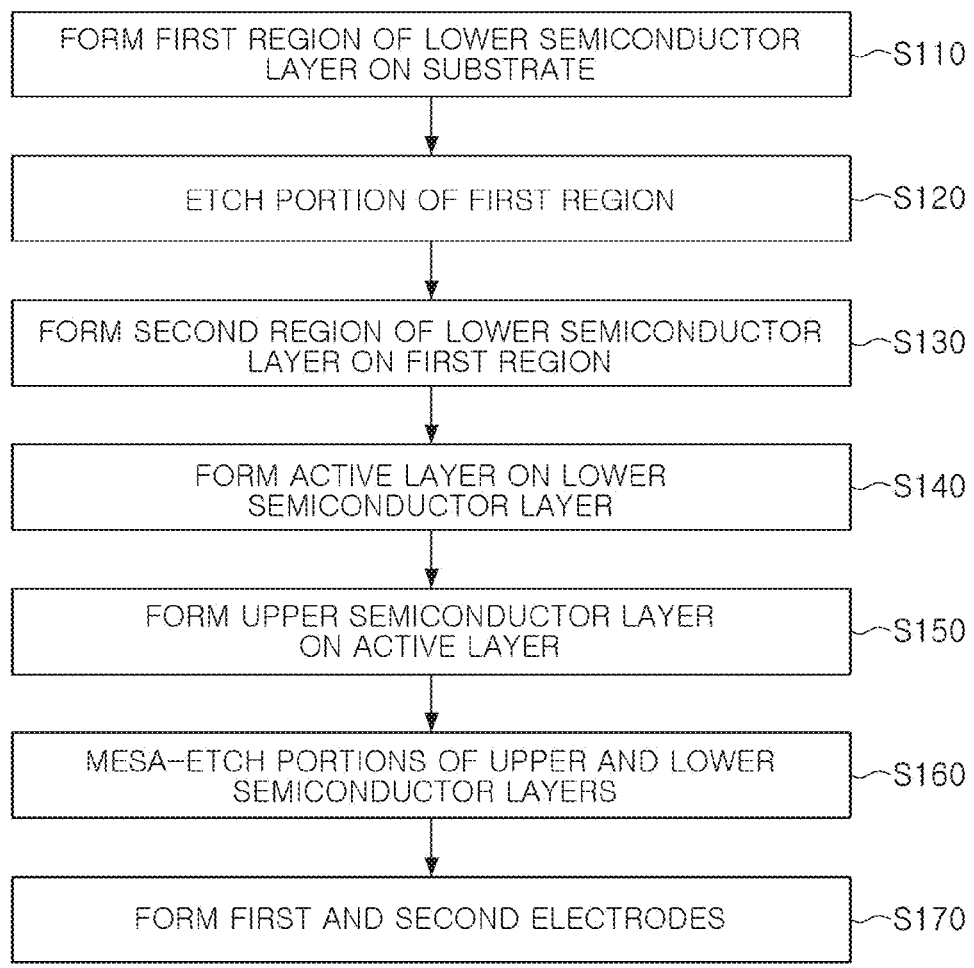
FIG. 10 is a flowchart illustrating a method of manufacturing a semiconductor light emitting device according to an exemplary embodiment.

FIG. 10 is a flowchart illustrating a method of manufacturing a semiconductor light emitting device according to an exemplary embodiment.

Figure 9A:
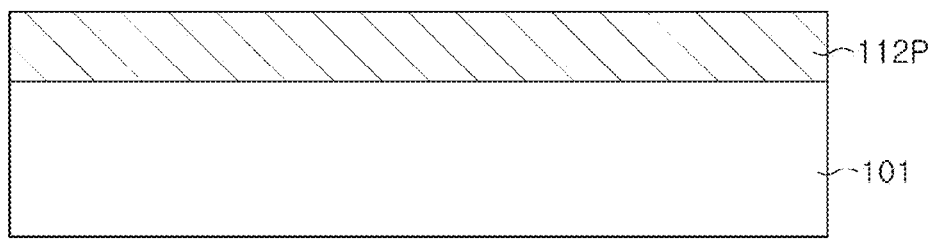
FIGS. 9A to 9F are cross-sectional views schematically illustrating processes of manufacturing a semiconductor light emitting device according to an exemplary embodiment.

With reference to FIGS. 9A and 10, a first region of a lower semiconductor layer may be formed on a substrate 101 in S110. For example, the first region may correspond to a first buffer layer 112P as shown in FIG. 9A.

The lower semiconductor layer may refer to layers disposed below an active layer 140 (see FIG. 1). The substrate 101 may be a semiconductor growth substrate, and may be a heterogeneous substrate for a nitride-based semiconductor layer to be grown on an upper portion of the substrate. The first buffer layer 112P may be a layer for improvement in crystallinity of semiconductor layers to be grown, and may have a thermal expansion coefficient different from that of the substrate 101. For example, when an ultraviolet light emitting device is manufactured, the first buffer layer 112P may be an MN layer having a relatively high level of bandgap energy.

The first buffer layer 112P may be formed on the substrate 101 by a metal organic chemical vapor deposition (MOCVD) or hydride vapor phase epitaxy (HVPE) process. When the first buffer layer 112P is an AlN layer, a source material, trimethylaluminum (TMAl) and ammonia ($NH_3$), may be introduced into a chamber to allow for growth of an MN layer. This process may be performed at a temperature lower than 1400° C., for example, at about 1150° C. to about 1250° C., and at a pressure equal to or lower than about 200 mbar. A flow amount of $NH_3$ and TMAl may be controlled in such a way that a ratio of a group V element, nitrogen, to a group III element, aluminum, may be maintained as about 200 or less in the chamber. Thus, a reaction in a gas state may be reduced, and a migration length of a source material on a growth surface may be secured. Hydrogen ($H_2$) gas may be used as carrier gas.

In the exemplary embodiment, concave-convex portions are formed in a subsequent process to secure crystallinity, and thus, in the case that a UV light emitting device is manufactured, lower semiconductor layers including the first buffer layer 112P may also be grown at a relatively low temperature. Thus, equipment the same as a blue light emitting device may be used.

In some exemplary embodiments, before forming the first buffer layer 112P, the inside of the chamber may be heated to a temperature to desorb a pollution material from an upper surface of the substrate 101. The temperature may be predetermined.

Figure 9B:
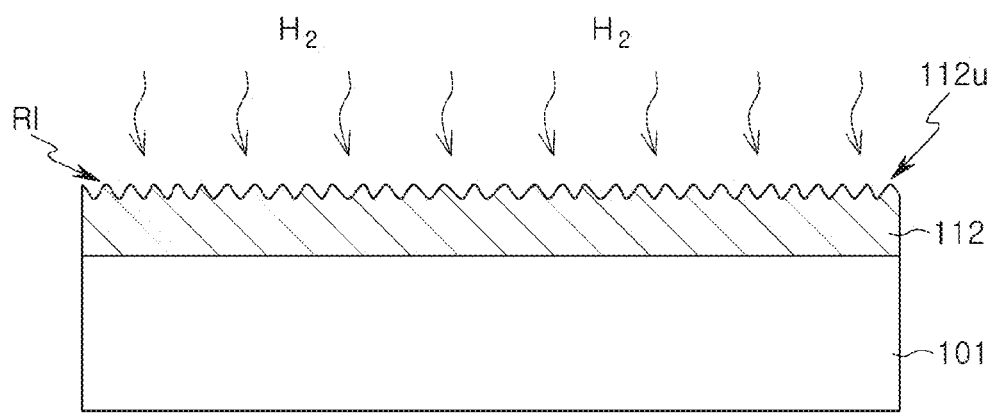

With reference to FIGS. 9B and 10, a portion of the first region of the lower semiconductor layer may be etched in S120. For example, a portion of the first buffer layer 112P may be etched as shown in FIG. 9B.

An upper surface of the first buffer layer 112P may be etched using hydrogen ($H_2$) gas. The present process may be performed in-situ in the same chamber used in the process S110, such as in a single MOCVD chamber. In this case, a flow of a nitride source gas material, ammonia, may be stopped or significantly reduced, while the flow of hydrogen ($H_2$) gas having been used as carrier gas in S110 may be maintained, and thus etching may be performed. Thus, a first buffer layer 112 having an upper surface 112u on which the concave-convex portions RI are formed may be formed.

An etched extent of the first buffer layer 112 may be adjusted by controlling a temperature and pressure in the chamber and an etching period of time. For example, when the temperature is relatively high or a pressure is relatively low, an etching rate may be increased. For example, the concave-convex portions RI as in FIG. 1 may be formed by being etched at a temperature of about 1200° C. or lower, and the voids VD as in FIG. 2 may be formed by being etched at a temperature higher than about 1200° C., or by increasing an etching period of time.

Figure 9C:
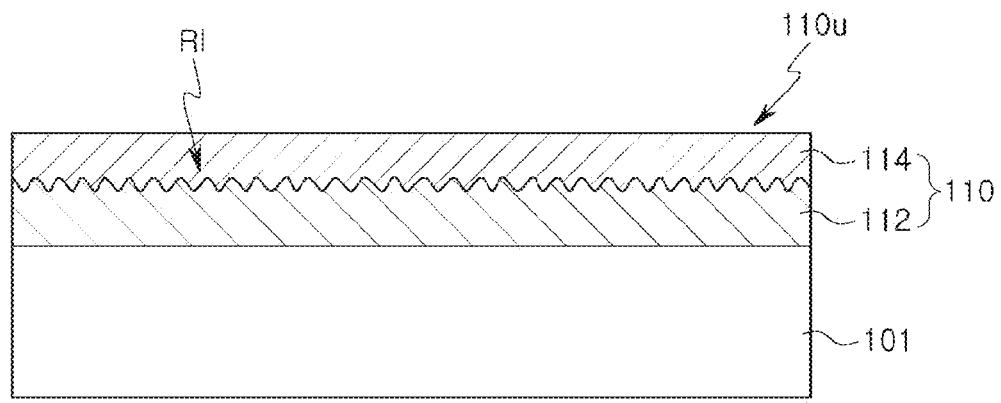
Figure 9D:
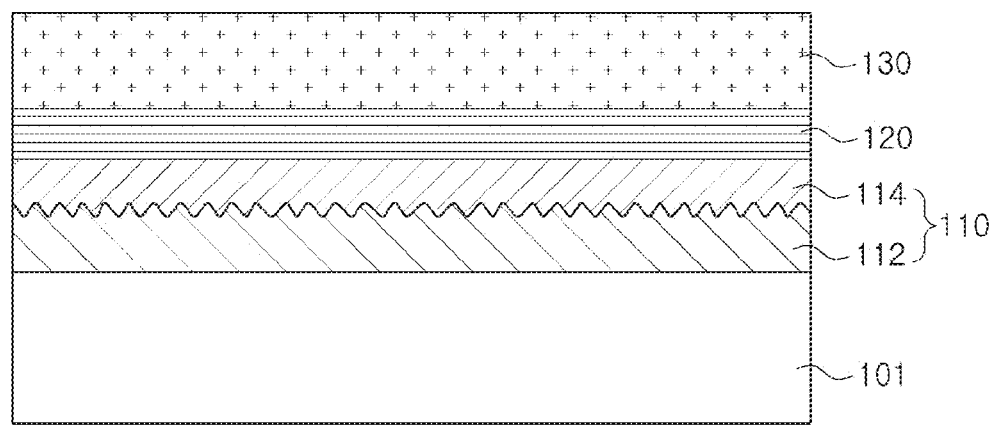

With reference to FIGS. 9C, 9D, and 10, a second region of the lower semiconductor layer, a superlattice layer 120, and a first conductivity-type semiconductor layer 130 may be formed on the first buffer layer 112. For example, the second region of the lower semiconductor layer may correspond to a second buffer layer 114 as shown in FIG. 9C.

First, as illustrated in FIG. 9C, the second buffer layer 114 may be formed. Processing conditions and thicknesses may be controlled in consideration of sizes of the concave-convex portions RI, that is, a degree of roughness of an upper surface of the first buffer layer 112, in such a way that the upper surface 110u of the second buffer layer 114 may be formed to be flat.

The second buffer layer 114 may be formed of a material the same as or different from that of the first buffer layer 112. The second buffer layer 114 may be configured of a single layer or a plurality of layers, and may also include a conductive impurity equal to that of the first conductivity-type semiconductor layer 130 in some exemplary embodiments.

Then, as illustrated in FIG. 9D, the superlattice layer 120 and the first conductivity-type semiconductor layer 130 may be formed on the second buffer layer 114.

The second buffer layer 114, the superlattice layer 120, and at least a portion of the first conductivity-type semiconductor layer 130 may be formed in-situ in the same chamber used in S110 and S120.

Figure 9E:
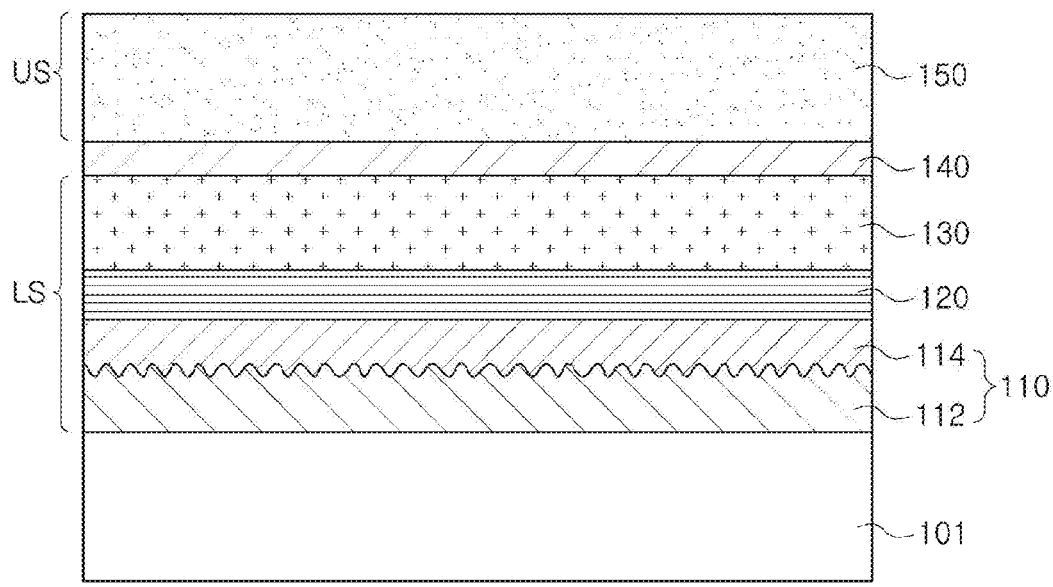

With reference to FIGS. 9E and 10, an active layer 140 may be formed on a lower semiconductor layer LS in S140, and an upper semiconductor layer US, for example, a second conductivity-type semiconductor layer 150, may be formed on the active layer 140 in S150.

The threading dislocation within the lower semiconductor layer LS may be reduced, and stress may be relieved by an etching process performed during the formation of the lower semiconductor layer LS. Thus, crystallinity of the active layer 140 formed on the lower semiconductor layer LS may be improved.

Although the exemplary embodiment illustrates a case in which the second conductivity-type semiconductor layer 150 is provided as the upper semiconductor layer US formed on the active layer 140, the upper semiconductor layer US may further include an additional semiconductor layer such as a current diffusion layer disposed between the active layer 140 and the second conductivity-type semiconductor layer 150. The current diffusion layer may include, for example, a superlattice layer containing a second conductivity-type impurity.

In some exemplary embodiments, all of the processes S110 to S150 from an operation of forming the lower semiconductor layer LS to an operation of forming the upper semiconductor layer US may also be performed in-situ in the same chamber.

Figure 9F:
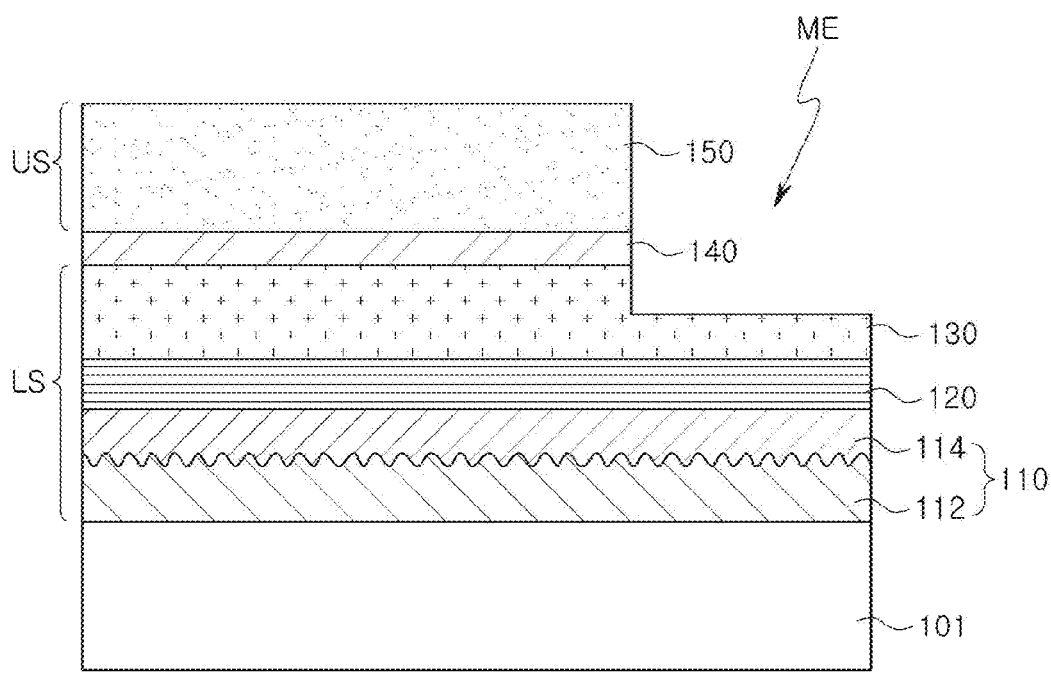

With reference to FIGS. 9F and 10, portions of the lower semiconductor layer LS and the upper semiconductor layer US may be mesa-etched in S160.

For example, portions of the first conductivity-type semiconductor layer 130, the active layer 140, and the second conductivity-type semiconductor layer 150 may be removed to allow a portion of the first conductivity-type semiconductor layer 130 to be exposed. Thus, the first conductivity-type semiconductor layer 130 may be exposed through a mesa-etched region ME.

Next, with reference to FIGS. 1 and 10, a first electrode 160 and a second electrode 170 may be formed on the first and second conductivity-type semiconductor layers 130 and 150, respectively, in S170.

The first and second electrodes 160 and 170 may be formed by depositing a conductive material. Thus, the manufacturing of the semiconductor light emitting device 100 of FIG. 1 may be completed.

Figure 11A:
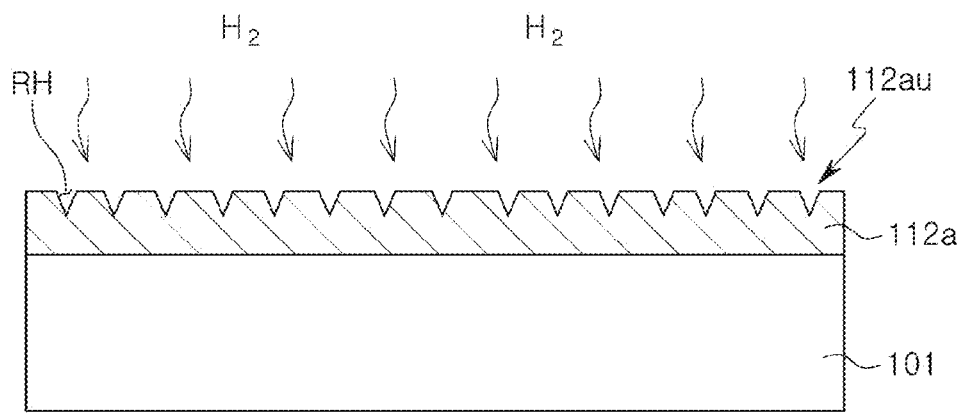
FIGS. 11A and 11B are cross-sectional views schematically illustrating processes of a method of manufacturing a semiconductor light emitting device according to an exemplary embodiment.
Figure 11B:
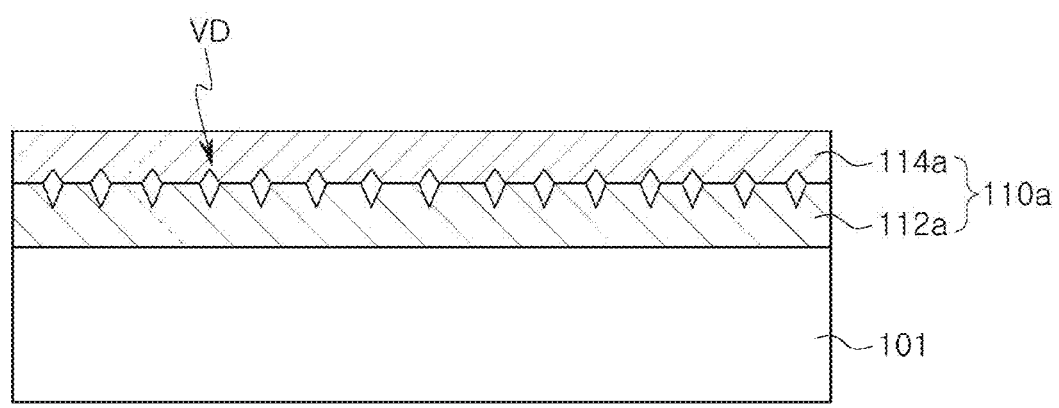

FIGS. 11A and 11B are cross-sectional views schematically illustrating principal processes of a method of manufacturing a semiconductor light emitting device according to an exemplary embodiment.

With reference to FIG. 11A, first, a first buffer layer 112P may be formed on a substrate 101 as described above with reference to FIG. 9A, and then an upper surface of the first buffer layer 112P may be etched using hydrogen ($H_2$) gas. Thus, grooves RH corresponding to concave-convex portions having a relatively deep depth may be formed in an upper surface 112au of the first buffer layer 112a.

In detail, in this exemplary embodiment, an etching process may be performed under processing conditions that an etching rate is higher than that in the process described above with reference to FIG. 9B. For example, an internal temperature of the chamber may be higher than about 1200° C., or a pressure thereof may be relatively low. Alternatively, an etching time may be relatively extended. Thus, the grooves RH having a relatively deep depth may be formed in the upper surface 112au of the first buffer layer 112a to be etched, and the grooves RH may be formed to have facets provided along crystal planes of the first buffer layer 112a, but are not limited thereto.

Although FIG. 11A only illustrates the grooves RH extended from the upper surface 112au of the first buffer layer 112a to the inside thereof by a depth, concave-convex portions having relatively small widths may also be formed on the upper surface 112au between the grooves RH. Sizes of the grooves RH, distances therebetween, and the like are not limited to the illustration of the drawings. The depths may be predetermined.

With reference to FIG. 11B, a second buffer layer 114a may be formed on the first buffer layer 112a.

The second buffer layer 114a may be grown upwardly and laterally from the upper surface 112au of the first buffer layer 112a between the grooves RH, simultaneously, to have a flat upper surface. Thus, a buffer layer 110a having the voids VD at an interface between the first buffer layer 112a and the second buffer layer 114a may be formed. Stress applied to semiconductor layers formed above the first buffer layer 112a may be further relieved by a buffering effect through the voids VD formed at the interface between the first buffer layer 112a and the second buffer layer 114a.

Subsequently, processes equal or similar to the processes described above with reference to FIGS. 9D to 9f may be performed after the process of FIG. 11B to thus manufacture a semiconductor light emitting device 100a of FIG. 2.

As illustrated in the exemplary embodiments of FIGS. 9A to 11B, an etching process may be performed to form an uneven surface on which concave-convex portions RI are formed, or to form voids VD, in at least one layer among the lower semiconductor layers LS disposed between the substrate 101 and the active layer 140. In some exemplary embodiments, both the uneven surface having concave-convex portions RI and the voids VD may be formed. In some exemplary embodiments, the uneven surface and the voids VD may be formed in two or more respective layers respectively. In addition, the concave-convex portions RI or the voids VD may be formed on at least one of interfaces between a plurality of layers forming the lower semiconductor layer LS.

Figure 12:
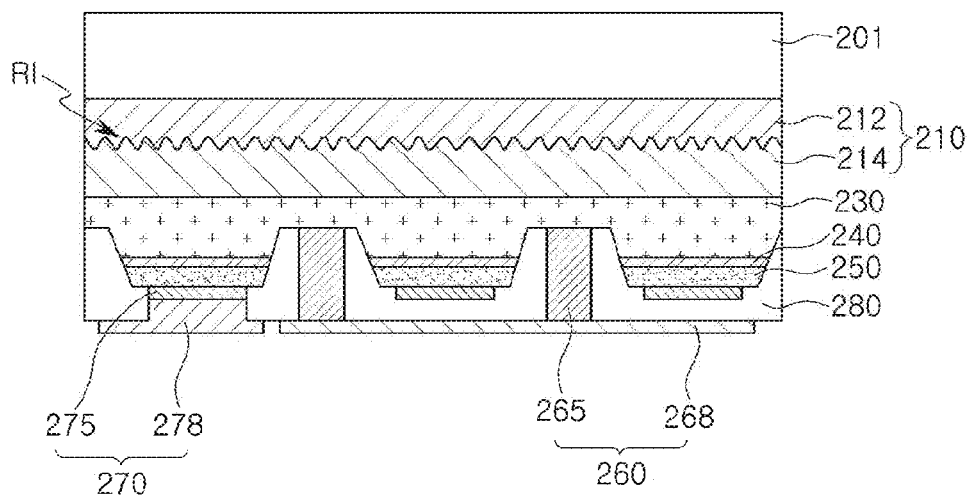
FIGS. 12 and 13 are cross sectional views illustrating exemplary embodiments of a semiconductor light emitting device.
Figure 13:
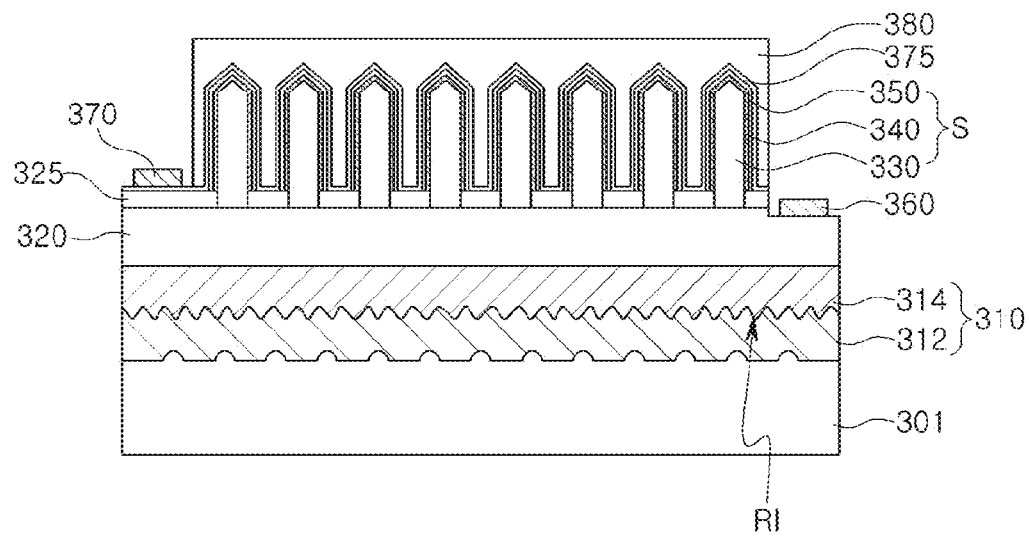

FIGS. 12 and 13 are cross sectional views illustrating example embodiments of a semiconductor light emitting device according to an exemplary embodiment.

With reference to FIG. 12, a semiconductor light emitting device 200 may include a substrate 201, a buffer layer 210 disposed on the substrate 201, a first conductivity-type semiconductor layer 230, an active layer 240, and a second conductivity-type semiconductor layer 250. The semiconductor light emitting device 200 may further include a first electrode 260 and a second electrode 270 respectively connected to the first and second conductivity-type semiconductor layers 230 and 250.

The substrate 201 may be a light transmitting substrate formed of, for example, sapphire. The buffer layer 210 may include first and second buffer layers 212 and 214, and concave-convex portions RI may be formed on an interface between the first and second buffer layers 212 and 214. In some exemplary embodiments, voids VD may be formed in addition to, or alternatively to, the concave-convex portions RI as discussed above.

The first conductivity-type semiconductor layer 230, the active layer 240, and the second conductivity-type semiconductor layer 250 may be light emitting structures and may be stacked on the substrate 201 and the buffer layer 210. In some exemplary embodiments, the first conductivity-type semiconductor layer 230 may include the concave-convex portions RI, the voids VD, or both therein, rather than using the buffer layer 210. In other exemplary embodiments, the first conductivity-type semiconductor layer 230 may include the concave-convex portions RI, the voids VD, or both therein together with the buffer layer 210.

Hereinafter, an overlapping description with respect to constituent elements referred to as the same terms as those in the illustration of FIG. 1 will be omitted.

The first electrode 260 may include connection electrode portions 265 having a conductive via penetrating through the second conductivity-type semiconductor layer 250 and the active layer 240 to be connected to the first conductivity-type semiconductor layer 230, and a first electrode pad 268 connected to the connection electrode portions 265. The connection electrode portions 265 may be surrounded by an insulating portion 280 to be electrically isolated from the active layer 240 and the second conductivity-type semiconductor layer 250. The number, shape, or pitch of the connection electrode portions 265, or a contact area thereof with the first conductivity-type semiconductor layer 230, and the like, may be appropriately designed, and thus contact resistance may be reduced. The second electrode 270 may include an ohmic contact layer 275 and a second electrode pad 278 on the second conductivity-type semiconductor layer 250.

The connection electrode portion 265 and the ohmic contact layer 275 may respectively have a structure in which a conductive material having an ohmic characteristic with the first and second conductivity-type semiconductor layers 230 and 250 is formed in a single layer or a multilayer structure. For example, the connection electrode portions 265 and the ohmic contact layers 275 may be formed of at least one of Ag, Al, Ni, Cr, and a transparent conductive oxide (TCO).

The first and second electrode pads 268 and 278 may be connected to the connection electrode portions 265 and the ohmic contact layers 275, respectively, so as to function as external terminals of the semiconductor light emitting device 200. For example, the first and second electrode pads 268 and 278 may include Au, Ag, Al, Ti, W, Cu, Sn, Ni, Pt, Cr, NiSn, TiW, AuSn, or a eutectic metal thereof. The first and second electrodes 260 and 270 may be disposed in a single direction and mounted on a lead frame, or the like, in a flip-chip form.

The first and second electrodes 260 and 270 may be electrically isolated from each other by the insulating portion 280. The insulating portion 280 may be formed of an insulating material, and a material having a relatively low light absorption rate may be used. For example, a silicon oxide and a silicon nitride such as $SiO_2$, $SiO_xN_y$, $Si_xN_y$, or the like may be used as a material of the insulating portion 280. In some exemplary embodiments, the insulating portion 280 may have a light reflective structure in which a light reflective filler is distributed in a light transmitting material. Alternatively, in other exemplary embodiments, the insulating portion 280 may have a multilayer reflective structure in which a plurality of insulating layers having different refractive indices are alternately stacked.

With reference to FIG. 13, a semiconductor light emitting device 300 may include a substrate 301 and light emitting nanostructures S disposed on the substrate 301. The light emitting nanostructure S may include a first conductivity-type semiconductor core 330, an active layer 340, and a second conductivity-type semiconductor layer 350. The semiconductor light emitting device 300 may further include a base layer 320 and an insulating layer 325 disposed between the substrate 301 and the light emitting nanostructures S, a transparent electrode layer 375 and an encapsulating layer 380 covering the light emitting nanostructures S, and first and second electrodes 360 and 370 having an electrode structure.

The substrate 301 may be, for example, a sapphire, Si or GaN substrate. Concave-convex portions are formed on an upper surface of the substrate 301 to improve light extraction efficiency. The buffer layer 310 may include first and second buffer layers 312 and 314, and concave-convex portions RI may be formed on an interface between the first and second buffer layers 312 and 314.

The base layer 320 may be disposed on the buffer layer 310. The base layer 320 may be a layer formed using a group III-V compound, such as a GaN layer. The base layer 320 may be an n-GaN layer doped with an n-type material. In this exemplary embodiment, the base layer 320 may be commonly connected to one side of each of the light emitting nanostructures S to serve as a contact electrode as well as providing a crystal plane for growth of the first conductivity-type semiconductor core 330. In some exemplary embodiments, the base layer 320 may include the concave-convex portions RI, the voids VD, or both therein, instead of the buffer layer 310. In other exemplary embodiments, the base layer 320 may include the concave-convex portions RI, the voids VD, or both therein together with the buffer layer 310.

The insulating layer 325 may be disposed on the base layer 320. The insulating layer 325 may be formed of silicon oxide or silicon nitride, and for example, may be formed of at least one of $SiO_x$, $SiO_xN_y$, $Si_xN_y$, $Al_2O_3$, TiN, AlN, ZrO, TiAlN, and TiSiN. The insulating layer 325 may include a plurality of openings allowing a portion of the base layer 320 to be exposed. Diameter, length, position, and growth conditions of the light emitting nanostructures S may be determined depending on a width of the plurality of openings. The plurality of openings may have various cross sectional surfaces such as a circular shape, a quadrangular shape, a hexagonal shape, and the like.

The plurality of light emitting nanostructures S may be located to correspond to positions in which the plurality of openings are formed, respectively. The light emitting nanostructures S may respectively have a core-shell structure including the first conductivity-type semiconductor core 330 grown from the base layer 320 exposed through the plurality of openings, and an active layer 340 and a second conductivity-type semiconductor layer 350 sequentially formed on a surface of the first conductivity-type semiconductor core 330.

The number of the light emitting nanostructures S included in the semiconductor light emitting device 300 is not limited to that depicted in the drawings, and the semiconductor light emitting device 300 may include, for example, tens to millions of light emitting nanostructures S. The light emitting nanostructure S according to this exemplary embodiment may be configured to include a lower hexagonal prism region and an upper hexagonal pyramid region. According to an exemplary embodiment, the light emitting nanostructure S may be pyramid or column shaped. The light emitting nanostructure S may have such a three-dimensional shape in order to have a relatively wide light emission surface area and increase light efficiency.

The transparent electrode layer 375 may cover upper surfaces and side surfaces of the light emitting nanostructures S, and may be disposed between the light emitting nanostructures S adjacent to each other to be connected therebetween. The transparent electrode layer 375 may include indium tin oxide (ITO), aluminum zinc oxide (AZO), indium zinc oxide (IZO), zinc oxide (ZnO), ZnO:Ga (GZO), indium oxide ($In_2O_3$), tin oxide ($SnO_2$), cadmium oxide (CdO), cadmium tin oxide ($CdSnO_4$), or gallium oxide ($Ga_2O_3$).

The encapsulating layer 380 may fill spaces between the light emitting nanostructures S while being disposed to cover the light emitting nanostructures S and the transparent electrode layers 375 formed on the light emitting nanostructures S. The encapsulating layer 380 may be formed of a light transmitting insulating material such as $SiO_2$, $SiN_x$, $Al_2O_3$, HfO, $TiO_2$ or ZrO.

The first and second electrodes 360 and 370 may be disposed on the base layer 320 and the transparent electrode layer 375 to be electrically connected thereto, respectively.

As the semiconductor light emitting devices 200 and 300 include an uneven surface on which concave-convex portions RI, voids VD, or both are formed in the buffer layers 210 and 310, respectively, stress may be relieved and a defect density may be reduced. Thus, a crystalline quality of upper semiconductor layers including the active layers 240 and 340, respectively, may be secured, and light characteristics of the respective semiconductor light emitting devices 200 and 300 may be improved.

Figure 14:
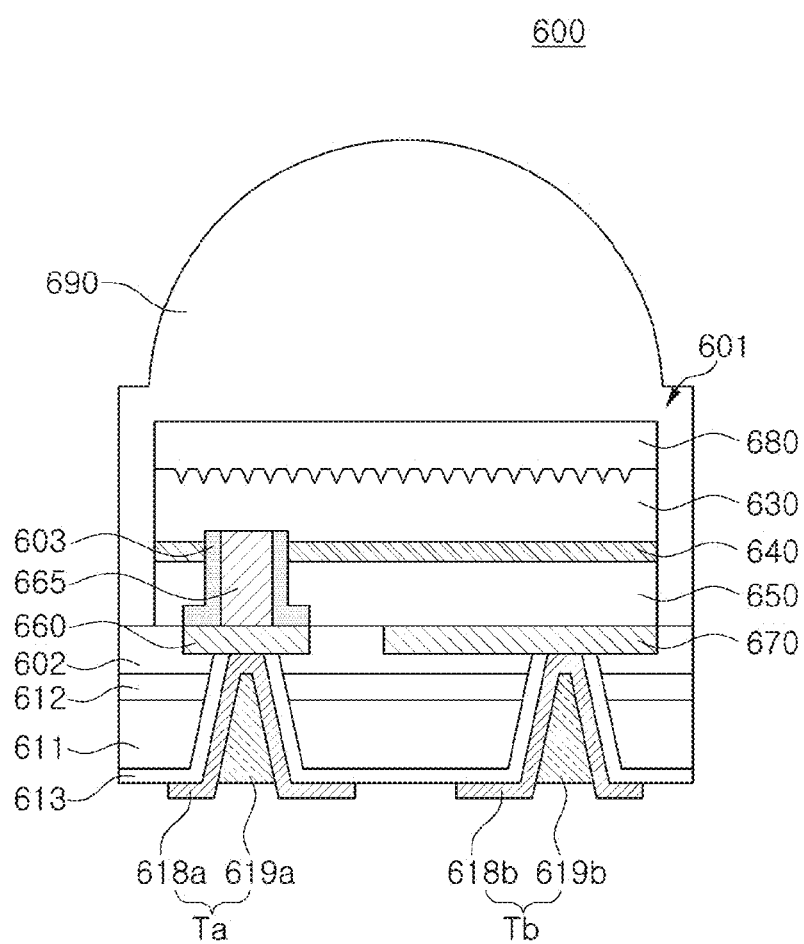
FIGS. 14 to 16 illustrate examples in which a semiconductor light emitting device according to an exemplary embodiment is applied to various packages.
Figure 15:
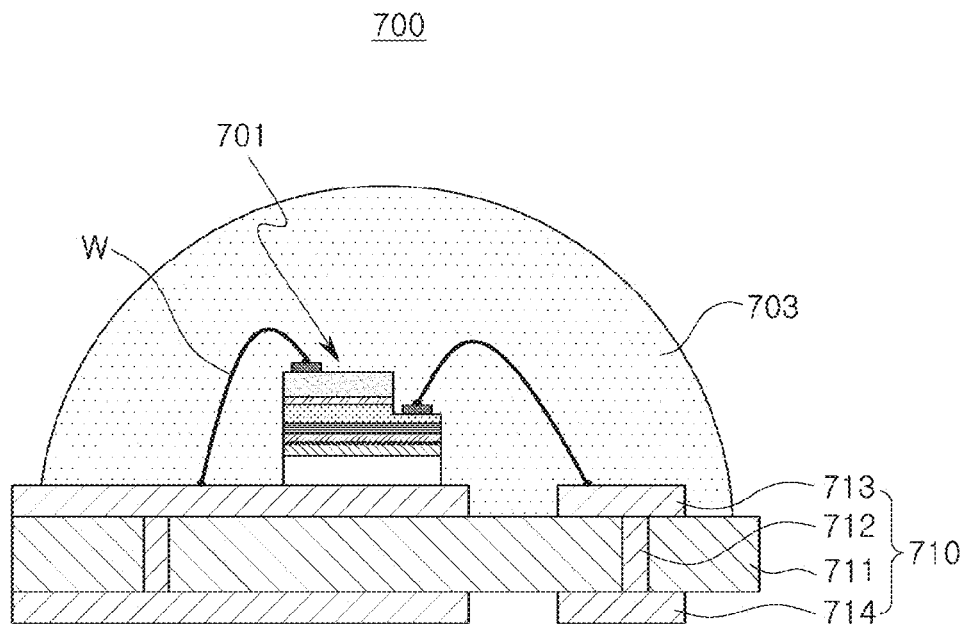
Figure 16:
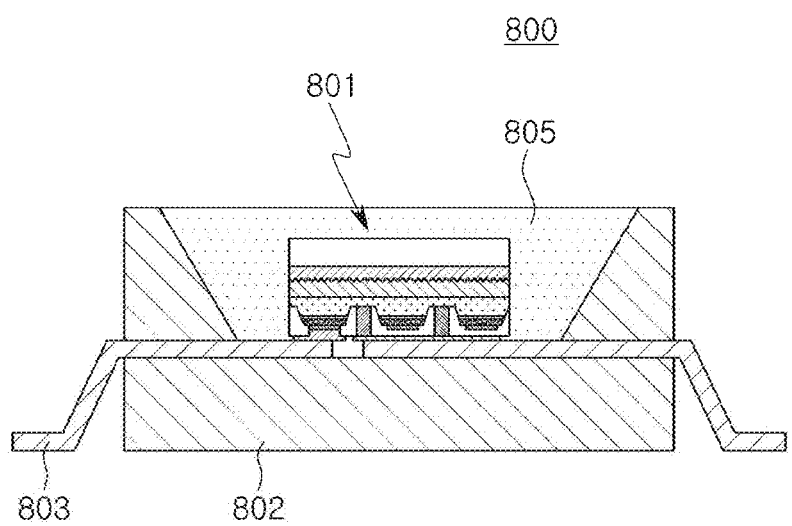

FIGS. 14 to 16 illustrate examples in which a semiconductor light emitting device according to an exemplary embodiment is applied to packages.

With reference to FIG. 14, a semiconductor light emitting device package 600 may include a light emitting device 601 disposed on a mounting substrate 611, first and second terminals Ta and Tb, and a lens 690. The light emitting device 601 may include a first conductivity-type semiconductor layer 630, an active layer 640, a second conductivity-type semiconductor layer 650, and a phosphor layer 680. In the semiconductor light emitting device package 600, an electrode may be formed on a lower surface of the light emitting device 601, a surface thereof opposite to a principal light extraction surface, and the phosphor layer 680 and a lens 690 may be integrally formed to thus have a chip scale package (CSP) structure.

The light emitting device 601 may be in a state in which the substrate 101 and the buffer layer 110 as in FIG. 1 or FIG. 2 have been removed, and concave-convex portions, voids, or both may be formed on a surface of the light emitting device from which the substrate has been removed. The phosphor layer 680, a light conversion layer, may be disposed on the surface on which the concave-convex portions, voids, or both are formed. The substrate and the buffer layer may be manufactured according to the method of manufacturing a semiconductor light emitting device according to an example embodiment described above with reference to FIG. 9A to FIG. 11B, and then may be removed during a package process. In some exemplary embodiments, at least one of the substrate and the buffer layer may not be removed.

First and second electrodes 660 and 670 may be connected to first and second conductivity-type semiconductor layers 630 and 650, respectively. The first electrode 660 may include a conductive via 665 penetrating through the second conductivity-type semiconductor layer 650 and the active layer 640 to be connected to the first conductivity-type semiconductor layer 630. The conductive via 665 may be prevented from being short-circuited with the active layer 640 and the second conductivity-type semiconductor layer 650 by an insulating layer 603 surrounding the conductive via 665. In this exemplary embodiment, although the conductive via 665 is provided as a single via by way of example, a plurality of conductive vias may also be arranged in various forms to contribute to current spread. Further, a diameter of the conductive via 665 may be determined in consideration of an area of the light emitting device 601.

The mounting substrate 611 may be a substrate such as a silicon substrate to which a semiconductor process may be easily applied, but is not limited thereto. The mounting substrate 611 and the light emitting device 601 may be bonded to each other by bonding layers 602 and 612. The bonding layers 602 and 612 may be formed of an insulating material or a conductive material, for example, formed of an oxide such as $SiO_2$, SiN or the like, a resin-based material such as a silicon resin, an epoxy resin, or the like, Ag, Al, Ti, W, Cu, Sn, Ni, Pt, Cr, NiSn, TiW, AuSn, or a eutectic metal thereof.

In some exemplary embodiments, the bonding layer 602 and 612 may be omitted, and the first and second electrodes 660 and 670 may be connected to the first and second terminals Ta and Tb of the mounting substrate 611, respectively. In some exemplary embodiments, the first and second electrodes 660 and 670 may be respectively configured of a plurality of metal layers. For example, the first and second electrodes 660 and 670 may include a solder bumper layer and an under bump metallurgy (UBM) layer containing a solder pad. In this case, the mounting substrate 611, the bonding layers 602 and 612, and the first and second terminals Ta and Tb may be omitted.

In the mounting substrate 611, a via may be formed from a lower surface of the mounting substrate 611 to be connected to the first and second electrodes 660 and 670 of the bonded light emitting device 601. An insulator 613 may be disposed on sides of the via and a lower surface of the mounting substrate 611. For example, when the mounting substrate 611 is a silicon substrate, the insulator 613 may be provided as a silicon oxide layer by a thermal oxidization process. The first and second terminals Ta and Tb may be formed by filling the vias with a conductive material, to be connected to the first and second electrodes 660 and 670, respectively. The first and second terminals Ta and Tb may include seed layers 618a and 618b, and plating filled portions 619a and 619b formed through a plating process using the seed layers 618a and 618b, respectively.

With reference to FIG. 15, a semiconductor light emitting device package 700 may include a semiconductor light emitting device 701 having the same structure as the illustration of FIG. 1 or FIG. 2, a mounting substrate 710, and an encapsulation body 703. That is, the semiconductor light emitting device 701 may include the concave-convex portions, voids, or both as described above.

The semiconductor light emitting device 701 may be mounted on the mounting substrate 710 to be electrically connected thereto through a wire W. The mounting substrate 710 may include a substrate body 711, an upper electrode 713, a lower electrode 714, and a through electrode 712 connecting the upper electrode 713 and the lower electrode 714 to each other. A body of the mounting substrate 710 may be formed of a resin, ceramic, or metal. The upper or lower electrode 713 or 714 may be a metal layer formed of a metal such as Au, Cu, Ag, or Al. For example, the mounting substrate 710 may be provided as a substrate such as a printed circuit board (PCB), a metal-core printed circuit board (MCPCB), an MPCB, a flexible printed circuit board (FPCB), or the like, and a structure of the mounting substrate 710 may be variously used.

An upper surface of the encapsulation body 703 may have a convex, dome-shaped lens structure, but according to an exemplary embodiment, the surface thereof may be a convex or a concave shaped lens structure, to be able to adjust an angle of beam spread in light emitted through the upper surface of the encapsulation body 703.

With reference to FIG. 16, a semiconductor light emitting device package 800 may include a semiconductor light emitting device 801 having the same structure as the illustration of FIG. 12, a package body 802, and a pair of lead frames 803.

The semiconductor light emitting device 801 may be mounted on the lead frames 803 in such a manner that respective electrodes are directly in contact with the lead frames to be electrically connected thereto. In an exemplary embodiment, the semiconductor light emitting device 801 may also be mounted on other regions instead of the lead frames 803, for example, in the package body 802. The package body 802 may have a cut shaped recess portion to improve light reflection efficiency. Such a recess portion may be provided with an encapsulation body 805 formed therein, and filled with a light transmitting material to encapsulate the semiconductor light emitting device 801. In some exemplary embodiments, the encapsulation body 805 may contain a wavelength conversion material such as a phosphor and/or a quantum dot.

FIGS. 17A and 17B are schematic views illustrating a white light source module according to an exemplary embodiment.

The white light source module illustrated in FIGS. 17A and 17B may respectively include a plurality of light emitting device packages mounted on a circuit board. The plurality of light emitting device packages mounted on a single white light source module may be configured of the same type of light emitting device packages generating light having the same wavelength or heterogeneous light emitting device packages generating light having different wavelengths.

With reference to FIG. 17A, a white light source module may be configured by combining white light emitting device packages '40' and '30' having color temperatures of 4000K and 3000K, respectively, and a red light emitting device package 'R'. The white light source module may be controlled to have a color temperature within a range of 3000K to 4000K, and may provide white light having a color rendering index Ra within a range of 85 to 100.

In some exemplary embodiments, the white light source module may only be configured of a white light emitting device package. In this case, the white light source module may include a white light emitting device package emitting white light having a color temperature different from that of FIG. 17A. For example, as illustrated in FIG. 17B, the white light source module may provide white light of which a color temperature may be adjusted to be within a range of 2700K to 5000K and of which a color rendering index Ra is within a range of 85 to 99 by combining a white light emitting device package '27' having a color temperature of 2700K and a white light emitting device package '50' having a color temperature of 5000K. Here, the number of light emitting device packages having a respective color temperature may be mainly changed depending on a preset value of a basic color temperature. For example, when the light source module is a lighting device having around 4000K of a preset basic value of color temperature, the number of packages corresponding to 4000K may be more than the number of packages corresponding to 3000K of color temperature or red light emitting device packages.

As such, the heterogeneous light emitting device packages may be configured in such a way that at least one of violet, blue, green, red, or infrared light emitting device packages is included in a light emitting device package emitting white light by combining yellow, green, red, orange, or blue phosphor with a blue or ultraviolet (UV) light emitting device. Thus, a color temperature and a color rendering index (CRI) of white light may be adjusted.

The white light source module may be used as a light source module 2040 of a bulb-type lighting device 2000 (see FIG. 21) described below.

Figure 18:
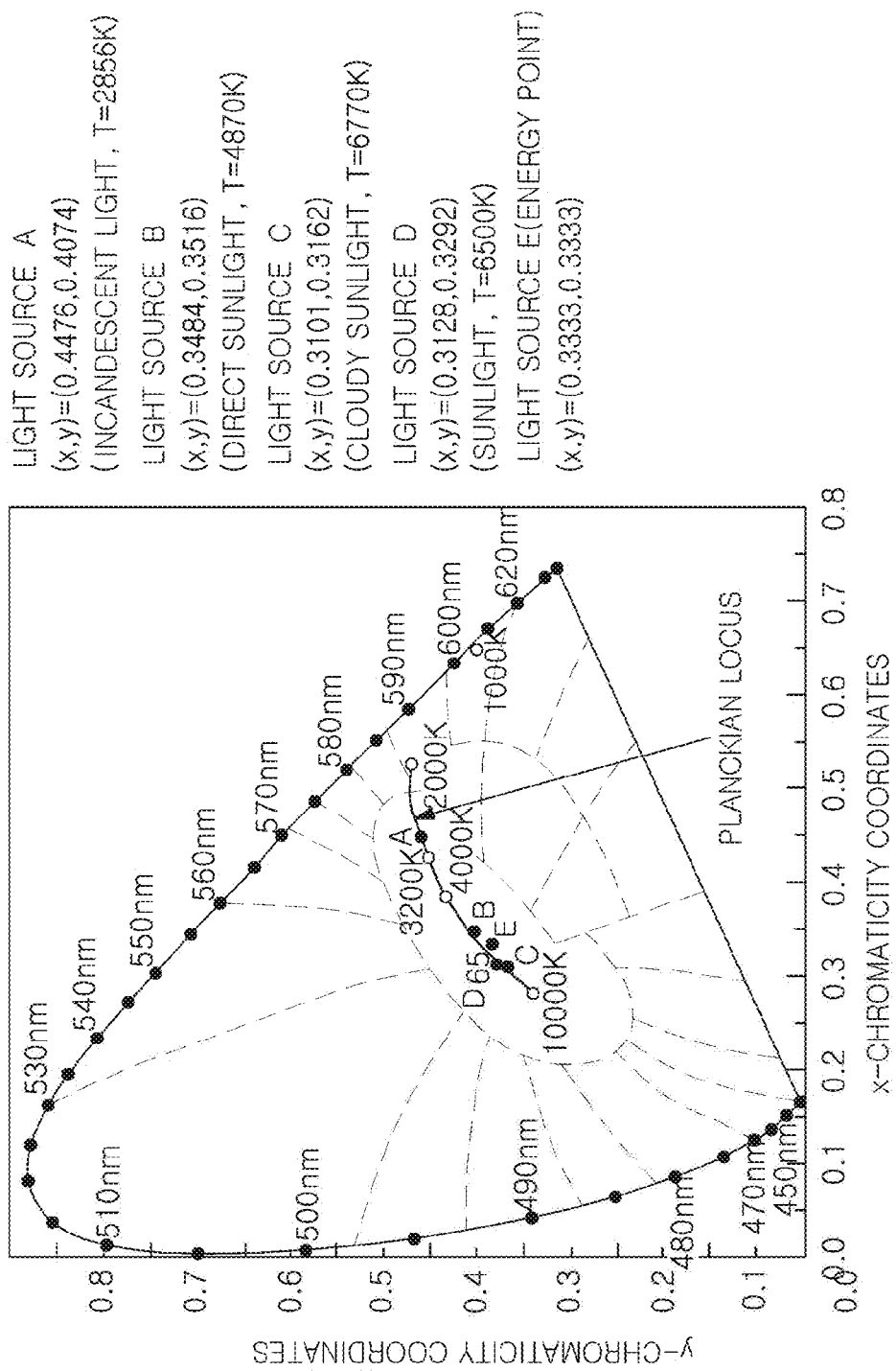
FIG. 18 shows a CIE 1931 color space chromaticity diagram illustrating a wavelength conversion material that may be applied to a semiconductor light emitting device package according to an exemplary embodiment.

FIG. 18 shows a CIE 1931 color space chromaticity diagram illustrating a wavelength conversion material that may be applied to a semiconductor light emitting device package according to an exemplary embodiment.

In a single light emitting device package, light having a color may be determined depending on a wavelength of light from a light emitting diode (LED) chip, a light emitting device, and a phosphor type and a combination ratio of phosphors. In the case of the white light emitting device package, a color temperature and a color rendering index may be controlled thereby.

For example, when the LED chip emits blue light or UV rays, a light emitting device package including at least one of yellow, green, red, and blue phosphors may emit white light having various color temperatures according to a phosphor combination ratio. In a manner different therefrom, a light emitting device package to which a green or red phosphor is applied to a blue LED chip may emit green or red light. As such, by combining the light emitting device package emitting white light and the light emitting device package emitting green or red light, a color rendering index and a color temperature of white light may be controlled. In addition, a light emitting device package may also be configured to include at least one light emitting device emitting violet light, blue light, green light, red light, or infrared light.

In this case, in the lighting device, CRI may be controlled in a sodium lamp to a solar light level, and various types of white light having a color temperature of around 1500K to around 20000K may be generated. A lighting color may be adjusted to be appropriate for an ambient atmosphere or for people's moods by generating violet, blue, green, red, orange visible light or infrared light as needed. Further, the lighting device may also emit light within a special wavelength band, capable of promoting plant growth.

White light obtained by combining yellow, green, red, blue phosphors and/or green and red light emitting devices with a blue or UV light emitting device may have two or more peak wavelengths, and coordinates (x, y) of the CIE 1931 color space chromaticity diagram illustrated in FIG. 18 may be located on line segments (0.4476, 0.4074), (0.3484, 0.3516), (0.3101, 0.3162), (0.3128, 0.3292), and (0.3333, 0.3333) connected to one another. Alternatively, the coordinates (x, y) may be located in a region surrounded by the line segments and blackbody radiation spectrum. A color temperature of white light may be within a range of 1500K to 20000K. In FIG. 18, white light in the vicinity of a point E (0.3333, 0.3333) below the blackbody radiation spectrum may be in a state in which light of a yellow-based component becomes relatively weak. This white light may be used as an illumination light source of a region in which a relatively bright or refreshing mood may be provided to the naked eye. Thus, a lighting device product using white light in the vicinity of the point E (0.3333, 0.3333) below the blackbody radiation spectrum may be effective for use in retail spaces in which groceries, clothing, or the like are for sale.

As a material for conversion of wavelength of light emitted from a semiconductor light emitting device, various materials such as a phosphor and/or a quantum dot may be used.

Phosphors may be represented by the following empirical formulae and have a color as below.

Oxide-based Phosphor: Yellow and green $Y_3Al_5O_{12}$:Ce, $Tb_3Al_5O_{12}$:Ce, $Lu_3Al_5O_{12}$:Ce Silicate-based Phosphor: Yellow and green $(Ba,Sr)_2SiO_4$:Eu, yellow and yellowish-orange $(Ba,Sr)_3SiO_5$:Ce Nitride-based Phosphor: Green β-SiAlON:Eu, Yellow $La_3Si_6N_{11}$:Ce, Yellowish-orange α-SiAlON:Eu, Red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}Ni_{8-x-y}$ (0.5≤x≤3, 0≤z≤0.3, 0≤y≤4)(Here, Ln may be at least one element selected from a group consisting of group Ma elements and rare-earth elements, and M may be at least one element selected from a group consisting of Ca, Ba, Sr, and Mg)

Fluoride-based Phosphor: KSF-based red $K_2SiF_6$:$Mn_4^+$, $K_2TiF_6$:$Mn_4^+$, $NaYF_4$:$Mn_4^+$, $NaGdF_4$:$Mn_4^+$, $K_3SiF_7$:$Mn^{4+}$ A composition of phosphor should basically coincide with stoichiometry, and respective elements may be substituted with other elements in respective groups of the periodic table of elements. For example, Sr may be substituted with Ba, Ca, Mg, or the like, of an alkaline earth group II, and Y may be substituted with lanthanum-based Tb, Lu, Sc, Gd, or the like. Eu or the like, an activator, may be substituted with Ce, Tb, Pr, Er, Yb, or the like, according to a required energy level, and an activator alone or a sub-activator or the like, for modification of characteristics thereof, may be additionally used.

In detail, in the case of a fluoride-based red phosphor, in order to improve reliability thereof at a relatively high temperature/high humidity, phosphors may be coated with a fluoride not containing Mn, or coated with an organic material on a phosphor surface or a Mn free-fluoride-coated surface. In the case of the fluoride-based red phosphor as described above, a narrow full width at half maximum of 40 nm or less may be obtained in a manner different from the case of other phosphors, and thus, the fluoride-based red phosphors may be used in high-resolution TV sets such as UHD TVs.

The following Table 1 illustrates phosphor types of white light emitting devices using a blue LED chip (440 to 460 nm) or a UV LED chip (380 to 440 nm) for each application field.

TABLE 1

| Use | Phosphor |
|---|---|
| LED TV BLU | β-SiAlON: $Eu^{2+}$, (Ca, Sr)AlSiN$_3$: $Eu^{2+}$, $La_3Si_6N_{11}$: $Ce^{3+}$, $K_2SiF_6$: $Mn^{4+}$, $SrLiAl_3N_4$: Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$: $Mn^{4+}$, $NaYF_4$: $Mn^{4+}$, $NaGdF_4$: $Mn^{4+}$ |
| Illumination | $Lu_3Al_5O_{12}$: $Ce^{3+}$, Ca-α-SiAlON: $Eu^{2+}$, $La_3Si_6N_{11}$: $Ce^{3+}$, (Ca, Sr)AlSiN$_3$: $Eu^{2+}$, $Y_3Al_5O_{12}$: $Ce^{3+}$, $K_2SiF_6$: $Mn^{4+}$, $SrLiAl_3N_4$: Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$: $Mn^{4+}$, $NaYF_4$: $Mn^{4+}$, $NaGdF_4$: $Mn^{4+}$ |
| Side Viewing (Mobile Devices, Laptop PCs) | $Lu_3Al_5O_{12}$: $Ce^{3+}$, Ca-α-SiAlON: $Eu^{2+}$, $La_3Si_6N_{11}$: $Ce^{3+}$, (Ca, Sr)AlSiN$_3$: $Eu^{2+}$, $Y_3Al_5O_{12}$: $Ce^{3+}$, (Sr, Ba, Ca, Mg)$_2SiO_4$: $Eu^{2+}$, $K_2SiF_6$: $Mn^{4+}$, $SrLiAl_3N_4$: Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$: $Mn^{4+}$, $NaYF_4$: $Mn^{4+}$, $NaGdF_4$: $Mn^{4+}$ |
| Vehicle Headlights (Head Lamps, etc.) | $Lu_3Al_5O_{12}$: $Ce^{3+}$, Ca-α-SiAlON: $Eu^{2+}$, $La_3Si_6N_{11}$: $Ce^{3+}$, (Ca, Sr)AlSiN$_3$: $Eu^{2+}$, $Y_3Al_5O_{12}$: $Ce^{3+}$, $K_2SiF_6$: $Mn^{4+}$, $SrLiAl_3N_4$: Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$: $Mn^{4+}$, $NaYF_4$: $Mn^{4+}$, $NaGdF_4$: $Mn^{4+}$ |

As a material of the wavelength conversion portion, wavelength conversion materials such as a quantum dot (QD) through a phosphor substitute or being mixed with a phosphor may be used.

Figure 19:
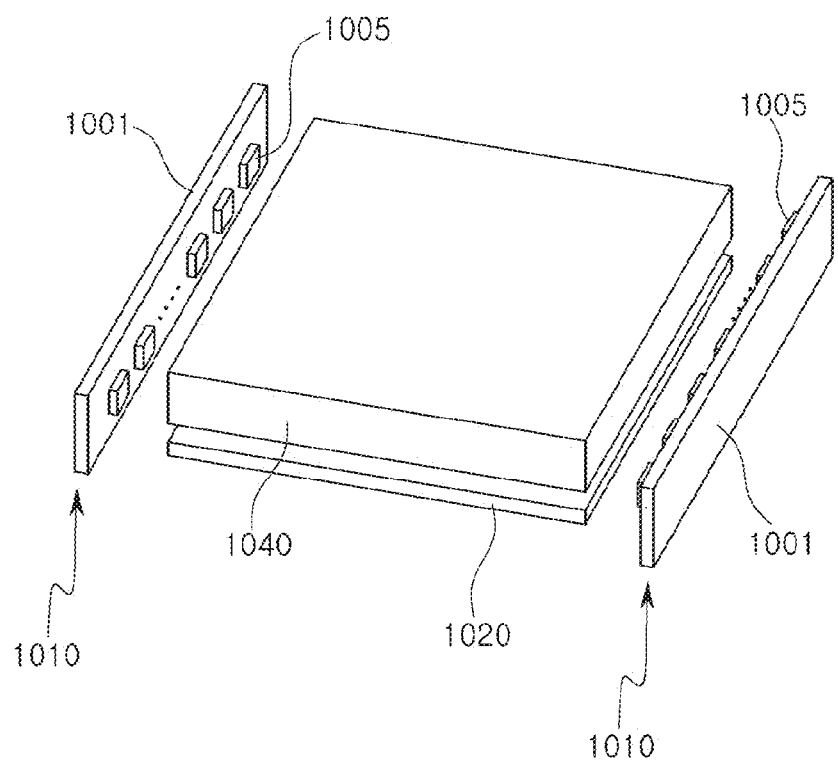
FIG. 19 is a schematic perspective view of a backlight according to an exemplary embodiment.

FIG. 19 is a schematic perspective view of a backlight according to an exemplary embodiment.

With reference to FIG. 19, a backlight 1000 may include a light guide plate 1040 and light source modules 1010 provided on both sides of the light guide plate 1040. The backlight 1000 may further include a reflective plate 1020 disposed below the light guide plate 1040. The backlight 1000 according to the example embodiment may be an edge-type backlight.

According to some exemplary embodiments, the light guide plate 1040 may only be provided on one side of the light source module 1010 or additionally provided on another side thereof. The light source module 1010 may include a printed circuit board 1001 and a plurality of light emitting devices 1005 mounted on the printed circuit board 1001. The light emitting device 1005 may include the semiconductor light emitting device 100, 100a, 100b, 100c, 200, or 300 described with reference to FIGS. 1 to 4, FIG. 12, and FIG. 13.

Figure 20:
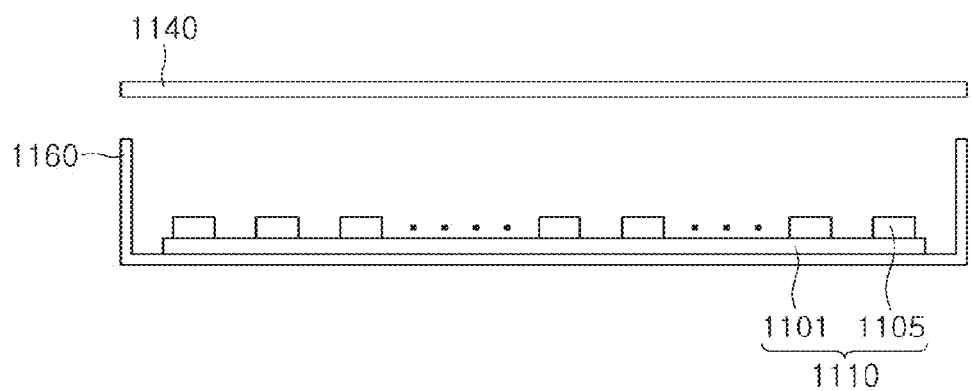
FIG. 20 is a schematic cross-sectional view of a backlight according to an exemplary embodiment.

FIG. 20 is a schematic cross-sectional view of a backlight according to an exemplary embodiment.

With reference to FIG. 20, a backlight 1100 may include a light diffusion plate 1140 and a light source module 1110 arranged below the light diffusion plate 1140. The backlight 1100 may further include a bottom case 1160 disposed below the light diffusion plate 1140 and accommodating the light source module 1110 therein. The backlight 1100 according to this exemplary embodiment may be a direct-type backlight.

The light source module 1110 may include a printed circuit board 1101 and a plurality of light emitting devices 1105 mounted on an upper surface of the printed circuit board 1101. The light emitting device 1105 may include a semiconductor light emitting device 100, 100a, 100b, 100c, 200, or 300 of FIGS. 1 to 4, FIG. 12, and FIG. 13.

Figure 21:
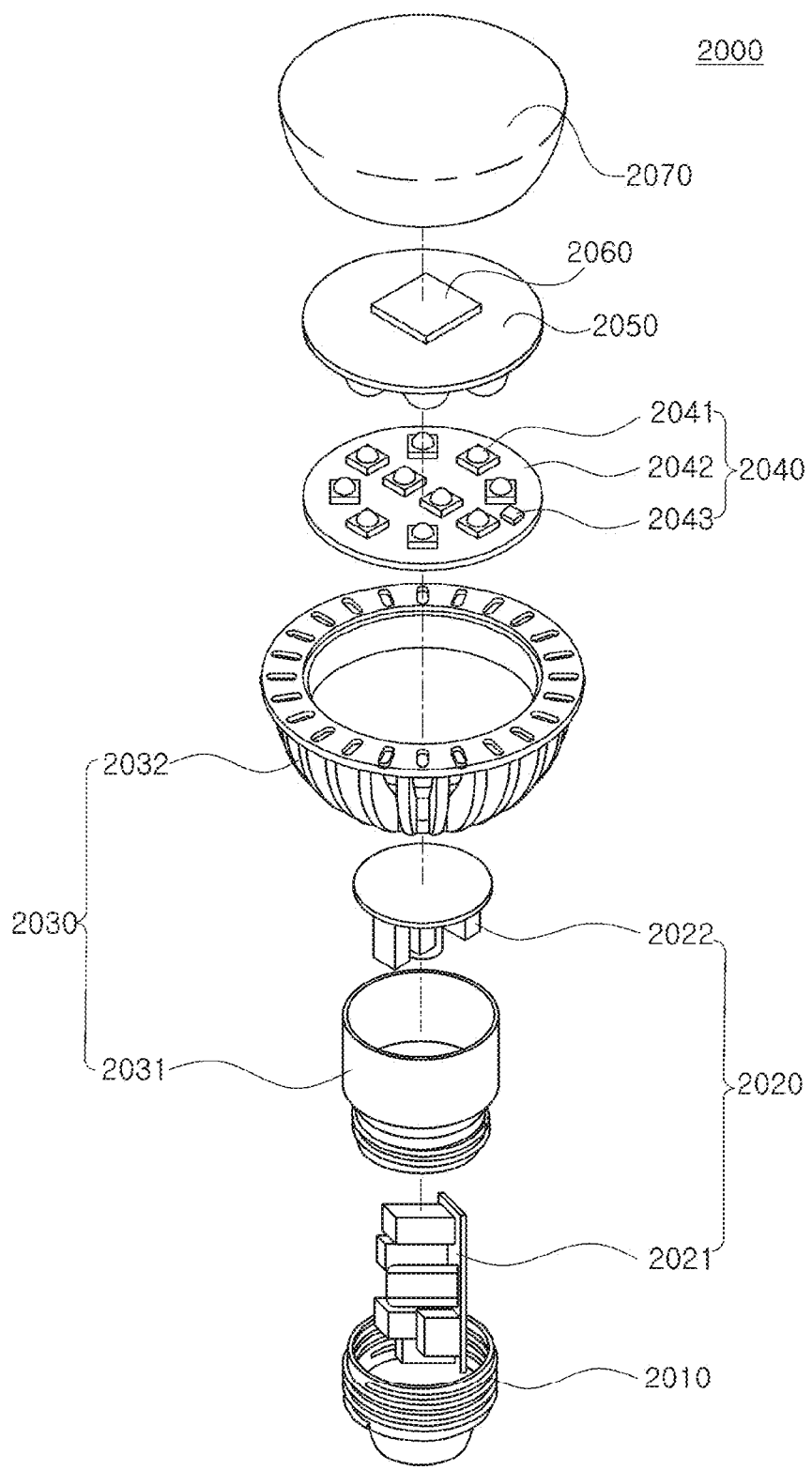
FIG. 21 is an exploded perspective view schematically illustrating a lamp including a communications module according to an exemplary embodiment.

FIG. 21 is an exploded perspective view schematically illustrating a lamp including a communications module according to an exemplary embodiment.

With reference to FIG. 21, a lighting device 2000 may include a socket 2010, a power supply 2020, a heat sink 2030, and a light source module 2040, and a cover 2070.

Power supplied to the lighting device 2000 may be applied through the socket 2010 thereto. The socket 2010 may be configured to be substituted with an existing lighting apparatus. As illustrated in FIG. 21, the power supply 2020 may include a first power supply portion 2021 and a second power supply portion 2022 that are separated from or coupled to each other. The heat sink 2030 may include an internal radiation portion 2031 and an external radiation portion 2032. The internal radiation portion 2031 may be directly connected to the light source module 2040 and/or the power supply 2020, by which heat may be transferred to the external radiation portion 2032.

The light source module 2040 may receive power from the power supply 2020 to emit light to the cover 2070. The light source module 2040 may include one or more light emitting devices 2041, a circuit board 2042, and a controller 2043, and the controller 2043 may store driving information of the light emitting devices 2041 therein. The light emitting device 2041 may include a semiconductor light emitting device 100, 100a, 100b, 100c, 200, or 300 of FIGS. 1 to 4, FIG. 12, and FIG. 13.

A reflective plate 2050 may be provided above the light source module 2040. The reflective plate 2050 may allow for uniform spreading of light from a light source sideways and backwards so as to reduce a glare effect of light. The communications module 2060 may be mounted on an upper portion of the reflective plate 2050, and home-network communications may be implemented through the communications module 2060. For example, the communications module 2060 may be a wireless communications module using Zigbee, Wi-Fi, or Li-Fi, and may control illumination of a lighting device installed indoors or outdoors, such as switching on/off, adjustment of brightness, or the like, through a smartphone or a wireless controller. In addition, electronic products in the home or outdoors and automobile systems, such as TV sets, refrigerators, air conditioners, door locks, automobiles, or the like, may be controlled using a Li-Fi communications module that uses a visible light wavelength of a lighting device installed indoors or outdoors. The reflective plate 2050 and the communications module 2060 may be covered by the cover 2070. The cover 2070 may be configured to allow for light generated by the light source modules 2040 to be uniformly irradiated outwardly.

Figure 22:
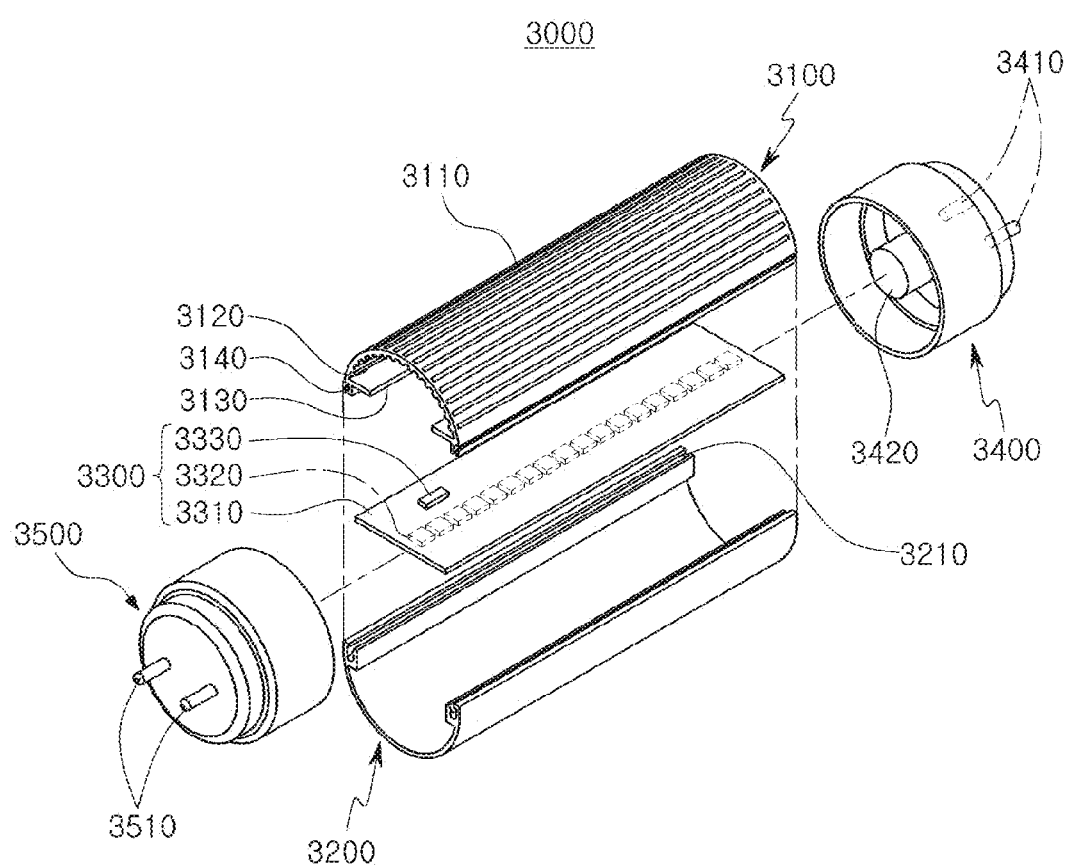
FIG. 22 is an exploded perspective view schematically illustrating a bar-type lamp according to an exemplary embodiment.

FIG. 22 is an exploded perspective view schematically illustrating a bar-type lamp according to an exemplary embodiment.

With reference to FIG. 22, a lighting device 3000 may include a heat sink member 3100, a cover 3200, a light source module 3300, a first socket 3400, and a second socket 3500.

A plurality of heat radiating fins 3110 and 3120 may be formed on an internal or/and external surface of the heat sink member 3100 in a concave-convex form, and the heat radiating fins 3110 and 3120 may be designed to have various shapes and gaps therebetween. A support portion 3130 having a protrusion form may be formed on an inner side of the heat sink member 3100. The light source module 3300 may be fixed to the support portion 3130. A stop protrusion 3140 may be formed on both ends of the heat sink member 3100.

A stop groove 3210 may be formed on the cover 3200. The stop groove 3210 may be coupled to the stop protrusion 3140 of the heat sink member 3100 in a hook coupling structure. Positions in which the stop groove 3210 and the stop protrusion 3140 are formed may also be inversely changed.

The light source module 3300 may include a light emitting device array. The light source module 3300 may include a printed circuit board 3310, a light source 3320, and a controller 3330. The light source 3320 may include a semiconductor light emitting device 100, 100*a*, 100*b*, 100*c*, 200, or 300 of FIGS. 1 to 4, FIG. 12, and FIG. 13. The controller 3330 may store driving information of the light source 3320 therein. The printed circuit board 3310 may be provided with circuit wirings formed therein, for operating the light source 3320, and may also include constituent elements for operating the light source 3320.

The first and second sockets 3400 and 3500 may be provided as a pair of sockets, and may have a structure in which they are coupled to both ends of a cylindrical cover unit configured of the heat sink member 3100 and the cover 3200. For example, the first socket 3400 may include electrode terminals 3410 and a power supply device 3420, and the second socket 3500 may include dummy terminals 3510 disposed thereon. In addition, an optical sensor and/or a communications module may be disposed inside one of the first socket 3400 or the second socket 3500. For example, the optical sensor and/or the communications module may be installed within the second socket 3500 in which the dummy terminals 3510 are disposed. In another example, an optical sensor and/or a communications module may be installed within the first socket 3400 in which the electrode terminals 3410 are disposed.

Figure 23:
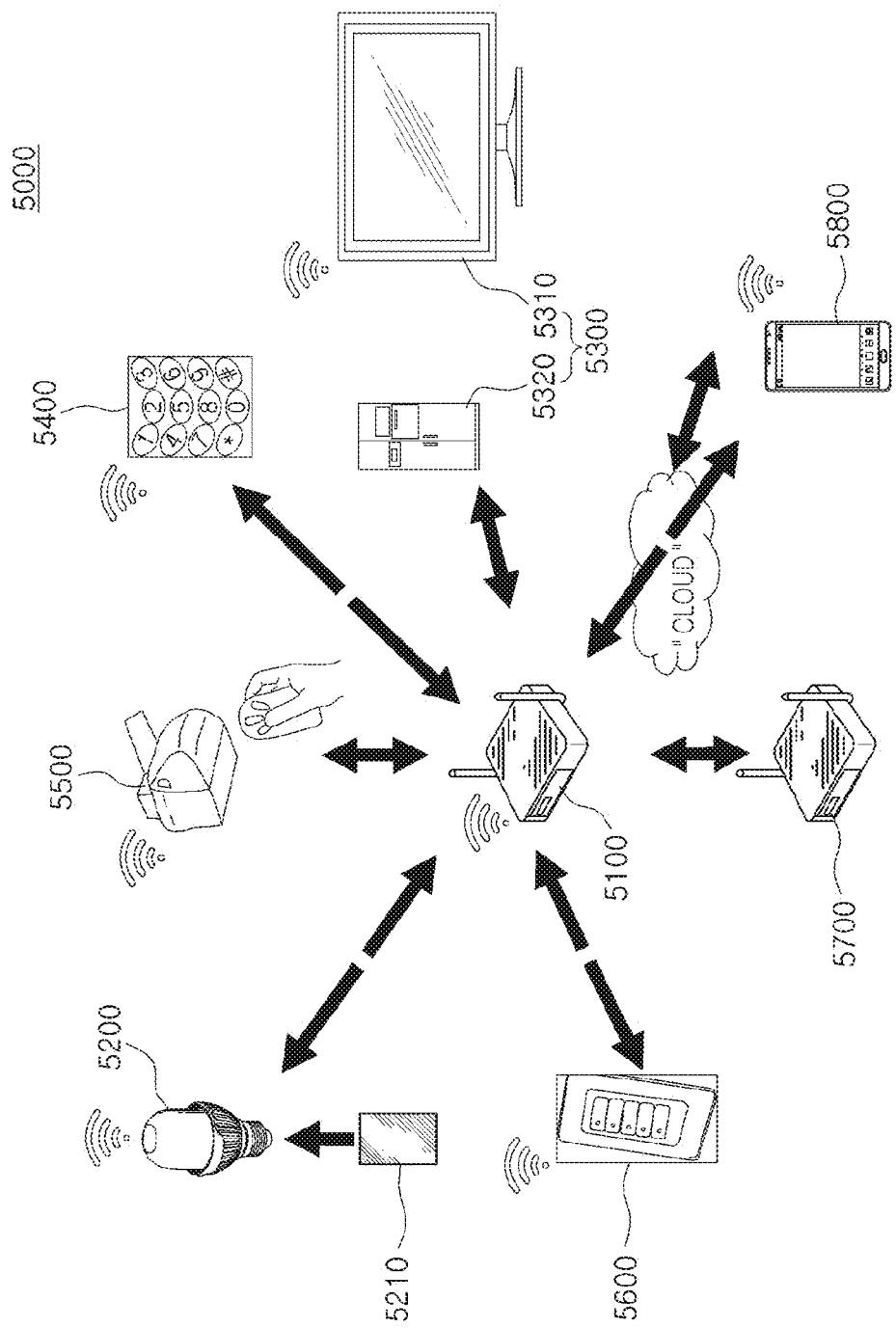
FIG. 23 is a schematic view illustrating an indoor lighting control network system.

FIG. 23 is a schematic view illustrating an indoor lighting controlling network system.

A network system 5000 according to this exemplary embodiment may be a composite smart lighting-network system in which lighting technology using a light emitting device such as an LED and the like, Internet-of-Things (IoT) technology, wireless communications technology, and the like converge with one another. The network system 5000 may be implemented using various lighting devices and wired/wireless communications devices, and implemented by a sensor, a controller, a communications device, a software for network control and maintenance, or the like.

The network system 5000 may be applied to an open space such as parks, roads, and the like as well as closed spaces defined as the inside of a building such as homes and offices. The network system 5000 may be implemented based on an Internet of Things environment to collect and process various information and provide a user with the information. In this case, an LED lamp 5200 included in the network system 5000 may receive information regarding an ambient environment from a gateway 5100 to control illumination of the LED lamp 5200, and may also perform a role of confirming and controlling an operating state of other devices 5300 to 5800 included in the Internet of Things environment, or the like, based on a function such as visible light communications of the LED lamp 5200, or the like.

With reference to FIG. 23, the network system 5000 may include the gateway 5100 processing data transmitted and received according to different communications protocols, the LED lamp 5200 connected to the gateway 5100 to communicate therewith and including an LED light emitting device, and the plurality of devices 5300 to 5800 connected to the gateway 5100 to be able to communicate therewith according to various wireless communications schemes. In order to implement the network system 5000 based on an Internet of Things environment, the respective devices 5300 to 5800 as well as the LED lamp 5200 may include at least one communications module. In some exemplary embodiments, the LED lamp 5200 may be connected to the gateway 5100 to be able to communicate therewith by a wireless communications protocol such as Wi-Fi, Zigbee, Li-Fi, or the like, and to this end, may include at least one communications module 5210 for a lamp.

As illustrated above with reference to FIG. 23, the network system 5000 may be applied to an open space such as roads or parks as well as a closed space such as homes or offices. For example, when the network system 5000 is applied to a home, the plurality of devices 5300 to 5800 included in the network system 5000 and connected to the gateway 5100 to be able to communicate therewith based on an Internet of Things technology may include home appliances 5300 such as a television set 5310 or a refrigerator 5320, a digital door lock 5400, a garage door lock 5500, a light switch 5600 installed on a wall or the like, a router 5700 for a wireless communications network relay, and a mobile device 5800 such as a smartphone, a tablet PC, a laptop computer, and the like.

In the network system 5000, the LED lamp 5200 may confirm an operating state of various devices 5300 to 5800 using a wireless communications network installed in a home, such as Zigbee, Wi-Fi, Li-Fi, or the like, or may automatically control illumination intensity of the LED lamp itself according to ambient environment and status. In addition, the devices 5300 to 5800 included in the network system 5000 may be controlled using Li-Fi communications that use visible rays of light emitted from the LED lamp 5200.

First, the LED lamp 5200 may automatically control illumination intensity thereof based on ambient environmental information transferred from the gateway 5100 through the communications module 5210 for lamp or ambient environmental information collected by a sensor installed in the LED lamp 5200. For example, the brightness of the LED lamp 5200 may be automatically adjusted according to a type of program broadcast on the television set 5310 or the brightness of a screen. To this end, the LED lamp 5200 may receive information regarding operation of the television set 5310 from the communications module 5210 for a lamp connected to the gateway 5100. The communications module 5210 for a lamp may be modularized with a sensor and/or a controller included in the LED lamp 5200.

For example, when a value of a broadcast TV program corresponds to a drama, illumination may also have a color temperature of 12000K or less to be appropriate thereto according to a preset value. For example, a color temperature may be reduced to 5000K, and a level of feeling of color may be adjusted to thus provide a comfortable atmosphere. In addition, for example, when a program value corresponds to a comedy, the network system 5000 may also be configured in such a way that a color temperature may be increased to 5000K or higher according to an illumination intensity set value and adjusted to provide blue-based white illumination.

In addition, when a time elapses after the digital door lock 5400 is locked in a state in which no person is in a home, all of the turned-on LED lamps 5200 may be turned off to thus reduce electrical consumption. Alternatively, in a case in which a security mode is preset through the mobile device 5800 or the like, when the digital door lock 5400 is locked in a state in which no person is in a home, the LED lamp 5200 may be maintained to be in a turned-on state.

An operation of the LED lamp 5200 may also be controlled according to ambient environmental information collected through various sensors connected to the network system 5000. For example, when the network system 5000 is implemented in a building, equipment management may be efficiently performed or idle space may be efficiently used by combining a lighting device, a position sensor, and a communications module in the building to collect people's positional information in the building and turn on or off the lighting device or provide the collected information in real time. Since lighting devices such as the LED lamp 5200 are generally disposed in the majority of spaces of respective floors in the building, various information regarding the building may be collected through a sensor integrated with the LED lamp 5200, and the collected information may be used for management of facilities and application of idle spaces thereto, and the like.

In different manners, the LED lamp 5200, an image sensor, a storage device, the communications module 5210 for a lamp, and the like may be combined with one another to thus be used in an apparatus capable of maintaining the security of a building or sensing and dealing with emergencies. For example, when a smoke or temperature sensor or the like is attached to the LED lamp 5200, damage may be significantly reduced by quickly sensing whether a fire and the like has occurred. In addition, the brightness of a lighting device may be controlled in consideration of weather or degree of sunlight, and the like, thereby providing a comfortable illumination environment.

Figure 24:
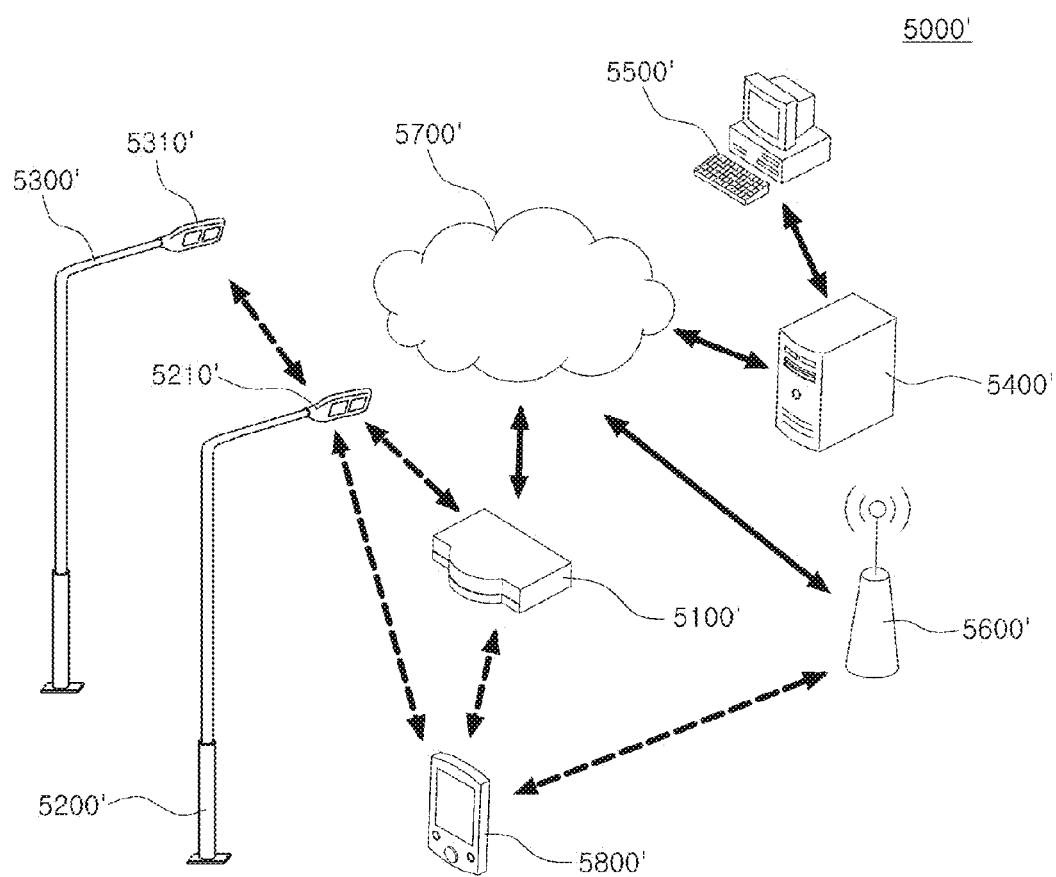
FIG. 24 illustrates an exemplary embodiment of a network system applied to an open space.

FIG. 24 illustrates an example embodiment of a network system applied to an open space.

With reference to FIG. 24, a network system 5000' according to an example embodiment may include a communications connection device 5100', a plurality of lighting fixtures 5200' and 5300' installed with a predetermined distance therebetween and connected to and communicating with the communications connection device 5100', a server 5400', a computer 5500' to manage the server 5400', a communications base station 5600', a communications network 5700' connecting the communications devices to each other, a mobile device 5800', and the like.

The plurality of lighting fixtures 5200' and 5300' installed in open external spaces such as roads or parks may include smart engines 5210' and 5310', respectively. The smart engines 5210' and 5310' may respectively include a light emitting device emitting light, a driver driving the light emitting device, a sensor collecting information regarding an ambient environment, a communications module, and the like. The smart engines 5210' and 5310' may communicate with other ambient devices according to a communications protocol such as Wi-Fi, Zigbee, Li-Fi, or the like.

In some exemplary embodiments, a single smart engine 5210' may be connected to another smart engine 5310' to be able to communicate therewith. In this case, a Wi-Fi mesh may be applied to communications between the smart engines 5210' and 5310'. At least one smart engine 5210' may be connected to the communications connection device 5100' that is connected to the communications network 5700', via wired/wireless communications. In order to increase communication efficiency, a plurality of smart engines 5210' and 5310' may be provided as one group to thus be connected to a single communications connection device 5100'.

The communications connection device 5100' may be provided as an access point (AP) through which wired/wireless communications may be carried, and may relay communications between the communications network 5700' and other devices. The communications connection device 5100' may be connected to the communications network 5700' via at least one of wired and wireless schemes, and in some exemplary embodiments, may be mechanically accommodated inside one of the lighting fixtures 5200' and 5300'.

The communications connection device 5100' may be connected to the mobile device 5800' via a communications protocol such as Wi-Fi or the like. A user of the mobile device 5800' may receive ambient environmental information collected by the plurality of smart engines 5210' and 5310' via the communications connection device 5100' connected to the smart engine 5210' of the lighting fixture 5200' adjacent thereto. The ambient environmental information may include surrounding traffic information, weather information, and the like. The mobile device 5800' may also be connected to the communications network 5700' in a wireless cellular communications scheme of 3G, 4G, or the like through the communications base station 5600'.

In a different manner, the server 5400' connected to the communications network 5700' may receive information collected by the smart engines 5210' and 5310' installed in the lighting fixtures 5200' and 5300', respectively, and may simultaneously monitor an operating state of the respective lighting fixtures 5200' and 5300' and the like. In order to manage the respective lighting fixtures 5200' and 5300' based on the monitoring result of an operating state of the respective lighting fixtures 5200' and 5300', the server 5400' may be connected to a computer 5500' providing a management system. The computer 5500' may execute software and the like that may monitor and manage an operating state of the smart engines 5210' and 5310'.

Figure 25:
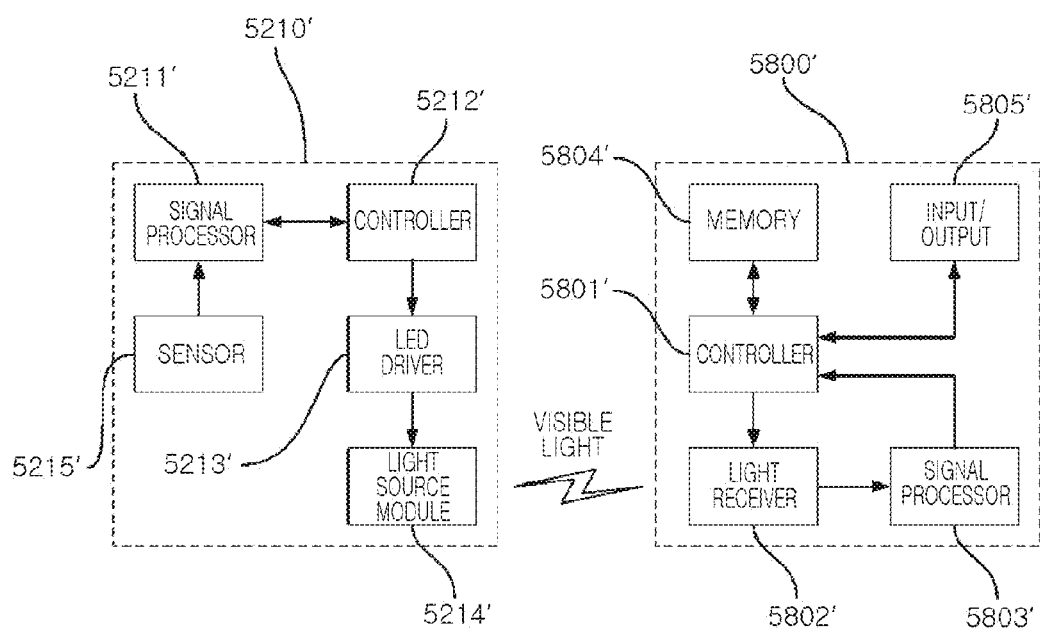
FIG. 25 is a block diagram illustrating communications operations between a smart engine of a lighting fixture and a mobile device via visible light wireless communications.

FIG. 25 is a block diagram illustrating a communications operation between a smart engine of a lighting fixture and a mobile device via visible light wireless communications.

With reference to FIG. 25, a smart engine 5210' may include a signal processor 5211', a controller 5212', an LED driver 5213', a light source module 5214', a sensor 5215', and the like. A mobile device 5800' connected to the smart engine 5210' via visible light wireless communications may include a controller 5801', a light receiver 5802', a signal processor 5803', a memory 5804', an input/output 5805', and the like.

The visible light wireless communications (Li-Fi) technology may be a wireless communications technology of transferring information in a wireless manner using light in a visible light wavelength band, perceptible to the human eye. Such a visible light wireless communication technology may be discerned from an existing wired optical communications technology and infrared wireless communications in that the light is within a visible light wavelength band, for example, a frequency of specific visible light from a light emitting package described in the example embodiment, and may also be discerned from a wired optical communications technology in that a communications environment thereof is wireless. In addition, the visible light wireless communications technology may provide convenience in that it may be freely used without regulations or permission in terms of using a frequency and discrimination that physical security is prominent and communications links may be confirmed by a user's eye, in a manner different from radio frequency (RF) wireless communications. Furthermore, the visible light wireless communications technology has convergence technology characteristics, by which a specific purpose of a light source and a communications function may be simultaneously obtained.

The signal processor 5211' of the smart engine 5210' may process data to be transmitted and received by the visible light wireless communications. In some exemplary embodiments, the signal processor 5211' may process information collected by the sensor 5215' as data to transmit the data to the controller 5212'. The controller 5212' may control operations of the signal processor 5211', the LED driver 5213', and the like, and in detail, may control operations of the LED driver 5213' based on the data transmitted by the signal processor 5211'. The LED driver 5213' may enable the light source module 5214' to emit light in response to a control signal transferred by the controller 5212', and thus transfer the data to the mobile device 5800'.

The mobile device 5800' may include a controller 5801', a memory 5804' storing data therein, an input/output 5805' including a display and a touchscreen, an audio output portion, a signal processor 5804', a light receiver 5802' for recognizing visible light including data, and the like. The light receiver 5802' may sense the visible light and convert the sensed visible light into an electrical signal. The signal processor 5803' may decode data included in the electrical signal converted by the light receiver. The controller 5801' may store data decoded by the signal processor 5803' in the memory 5804' or output the data through the input/output 5805' and the like so as to be perceived by a user.

As set forth above, according to various exemplary embodiments of the present inventive concept, semiconductor layers below an active layer may be formed to include an etched surface when the semiconductor layers below the active layer are formed, thereby providing a semiconductor light emitting device having improved light characteristics and a method of manufacturing the same.

While various exemplary embodiments have been shown and described above, it will be apparent to those skilled in the art that modifications and variations could be made without departing from the scope of the present inventive concept as defined by the appended claims.

What is claimed is:

1. A method of manufacturing a semiconductor light emitting device, the method comprising:
   forming a first region of a lower semiconductor layer on a substrate using a carrier gas and at least one source gas;
   etching an upper surface of the first region using only the carrier gas by reducing a flow of the at least one source gas while maintaining a flow of the carrier gas, in-situ in a chamber in which a process of forming the first region has been performed;
   forming a second region of the lower semiconductor layer on the first region;
   forming an active layer on the lower semiconductor layer; and
   forming an upper semiconductor layer on the active layer.

2. The method of claim 1, wherein the carrier gas is hydrogen (H2) gas.

3. The method of claim 1, wherein the etching the upper surface of the first region comprises etching the upper surface of the first region to form concave-convex portions on the upper surface of the first region.

4. The method of claim 3, wherein the second region is formed to have a flat upper surface and fill the concave-convex portions formed on the upper surface of the first region.

5. The method of claim 3, wherein the second region is formed to have a flat upper surface and form voids at the concave-convex portions formed on the upper surface of the first region.

6. The method of claim 1, wherein the forming the first region, the etching the upper surface of the first region from the upper surface, and the forming the second region are performed in-situ in the chamber.

7. The method of claim 1, wherein a portion of the first region and a portion of the second region adjacent to an interface between the first region and the second region are formed using a same material.

8. The method of claim 1, wherein the upper surface of the first region that has been etched is a layer formed of an aluminum nitride.

9. The method of claim 8, wherein in the etching the upper surface of the first region, an inflow of the at least one source gas for formation of the aluminum nitride is blocked.

10. The method of claim 1, wherein the lower semiconductor layer comprises a buffer layer and a first conductivity-type semiconductor layer sequentially provided on the substrate.

11. The method of claim 10, wherein the first region is formed of a portion of the buffer layer.

12. The method of claim 10, wherein the lower semiconductor layer further comprises a superlattice layer provided between the buffer layer and the first conductivity-type semiconductor layer.

13. A method of manufacturing a semiconductor light emitting device, the method comprising:
   forming a first region of a lower semiconductor layer on a substrate using a carrier gas and at least one source gas;
   etching a portion of the first region using only the carrier gas by reducing a flow of the at least one source gas while maintaining a flow of the carrier gas;
   forming a second region of the lower semiconductor layer on the first region;
   forming an active layer on the lower semiconductor layer; and
   forming an upper semiconductor layer on the active layer.

14. The method of claim 13, wherein the forming the first region and the etching the portion of the first region are performed in-situ with a single piece of equipment.

15. A method of manufacturing a semiconductor light emitting device comprising a plurality of semiconductor layers, the method comprising:
   etching, during a manufacturing process, a contact interface between two of the plurality of semiconductor layers using only a carrier gas by reducing a flow of at least one source gas while maintaining a flow of the carrier gas to form an uneven surface at the contact interface, the uneven surface preventing at least one of threading dislocations and cracks in semiconductor layers subsequently disposed in the manufacturing process; and forming an active layer on the plurality of semiconductor layers.

16. The method of claim 15, wherein, during the manufacturing process, the semiconductor layers are formed on a substrate, and wherein the substrate and a semiconductor layer contacting the substrate, of the plurality of semiconductor layers, are formed of different materials.

17. The method of claim 15, wherein the uneven surface comprises concave-convex portions.

18. The method of claim 17, wherein the uneven surface further comprises a plurality of voids.

19. The method of claim 15, wherein the uneven surface comprises a plurality of voids.

* * * * *